(12) United States Patent
Shao et al.

(10) Patent No.: US 12,414,291 B2
(45) Date of Patent: Sep. 9, 2025

(54) SEMICONDUCTOR STRUCTURE AND MANUFACTURING METHOD THEREOF, AND MEMORY

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 492 days.

(21) Appl. No.: 17/950,971

(22) Filed: Sep. 22, 2022

(65) Prior Publication Data

US 2023/0020007 A1 Jan. 19, 2023

Related U.S. Application Data

(63) Continuation of application No. PCT/CN2022/108180, filed on Jul. 27, 2022.

(30) Foreign Application Priority Data

Jun. 21, 2022 (CN) .......................... 202210708797.5

(51) Int. Cl.
*H10B 12/00* (2023.01)
(52) U.S. Cl.
CPC ....... *H10B 12/373* (2023.02); *H10B 12/0383* (2023.02); *H10B 12/0387* (2023.02); *H10B 12/05* (2023.02)
(58) Field of Classification Search
CPC ........... H10B 12/0383; H10B 12/0387; H10B 12/05; H10B 12/373; H10D 1/716
See application file for complete search history.

(56) References Cited

U.S. PATENT DOCUMENTS 5,571,730 A 11/1996 Park
2005/0048711 A1* 3/2005 Wang ..................... H10D 1/665
438/222

(Continued)

FOREIGN PATENT DOCUMENTS

CN 1767199 A 5/2006
CN 101874303 A 10/2010

(Continued)

*Primary Examiner* — Britt D Hanley
*Assistant Examiner* — Kevin Quinto
(74) *Attorney, Agent, or Firm* — SYNCODA LLC; Feng Ma

(57) ABSTRACT

A semiconductor structure includes a substrate, and a plurality of first semiconductor columns, a storage structure, a plurality of transistors and a first protective layer located above the substrate. The plurality of first semiconductor columns are arranged in array in first and second directions. Each first semiconductor column includes a first part and a second part located on same. The second part includes a bottom portion, an intermediate portion and a top portion. The first direction and the second direction intersect with each other and are both parallel to top surface of the substrate. The storage structure surrounds sidewalls of the first parts. The first protective layer surrounds sidewalls of the top portions of the second parts. A channel structure of each transistor is located in the intermediate portion of the second part, and an extending direction of the channel structure is the same as that of the second part.

20 Claims, 26 Drawing Sheets

(56) References Cited

U.S. PATENT DOCUMENTS

| | | |
|---|---|---|
| 2005/0285176 A1 | 12/2005 | Kim |
| 2008/0035976 A1 | 2/2008 | Kim |
| 2010/0295110 A1 | 11/2010 | Takaishi |
| 2011/0244302 A1 | 10/2011 | Wasson |
| 2012/0156844 A1 | 6/2012 | Kim |
| 2013/0148260 A1 | 6/2013 | Wasson |
| 2013/0234240 A1 | 9/2013 | Moon et al. |
| 2014/0035018 A1 | 2/2014 | Lee |
| 2015/0001617 A1 | 1/2015 | Kim et al. |
| 2015/0348976 A1 | 12/2015 | Moon et al. |
| 2018/0308923 A1 | 10/2018 | Wu et al. |
| 2019/0103407 A1 | 4/2019 | Kim et al. |
| 2019/0189617 A1 | 6/2019 | Kim et al. |
| 2019/0206982 A1 | 7/2019 | Wu et al. |
| 2019/0252387 A1 | 8/2019 | Moon et al. |
| 2019/0273081 A1 | 9/2019 | Moon et al. |
| 2020/0111793 A1 | 4/2020 | Kim et al. |
| 2020/0243532 A1 | 7/2020 | Kim et al. |
| 2021/0057416 A1 | 2/2021 | Kim et al. |
| 2021/0066306 A1 | 3/2021 | Tang et al. |
| 2021/0151440 A1 | 5/2021 | Tang et al. |
| 2021/0202485 A1 | 7/2021 | Inaba |
| 2021/0202490 A1 | 7/2021 | Cho et al. |
| 2022/0052151 A1 | 2/2022 | Wang |
| 2022/0173109 A1 | 6/2022 | Rigano |
| 2022/0246621 A1 | 8/2022 | Cho et al. |

FOREIGN PATENT DOCUMENTS

| | | |
|---|---|---|
| CN | 103311249 A | 9/2013 |
| CN | 108735744 A | 11/2018 |
| CN | 109065501 A | 12/2018 |
| CN | 109616474 A | 4/2019 |
| CN | 113078116 A | 7/2021 |
| CN | 113611671 A | 11/2021 |
| CN | 113707614 A | 11/2021 |
| CN | 114068414 A | 2/2022 |
| CN | 114078777 A | 2/2022 |
| CN | 114093821 A | 2/2022 |
| CN | 114256240 A | 3/2022 |
| CN | 114342065 A | 4/2022 |
| CN | 114373764 A | 4/2022 |
| CN | 114551450 A | 5/2022 |
| CN | 114582808 A | 6/2022 |
| JP | H0864777 A | 3/1996 |
| JP | 2013168570 A | 8/2013 |

\* cited by examiner

SEMICONDUCTOR STRUCTURE AND MANUFACTURING METHOD THEREOF, AND MEMORY

CROSS-REFERENCE TO RELATED APPLICATIONS

This application is a continuation of International Patent Application No. PCT/CN2022/108180, filed Jul. 27, 2022, which claims priority to Chinese Patent Application No. 202210708797.5, filed Jun. 21, 2022. The International Patent Application and the Chinese Patent Application are incorporated herein by reference in their entireties.

BACKGROUND

A storage array architecture of Dynamic Random Access Memory (DRAM) is an array composed of a storage unit which includes one transistor and one capacitor (that is, a 1T1C storage unit). For the transistor, a gate is connected to a Word Line (WL), a drain is connected to a Bit Line (BL), and a source is connected to the capacitor.

SUMMARY

The disclosure relates to, but is not limited to a semiconductor structure and a manufacturing method thereof, and a memory.

According to an aspect of the disclosure, there is provided a semiconductor structure, including: a substrate, and a plurality of first semiconductor columns, a storage structure, a plurality of transistors and a first protective layer that are located above the substrate.

The plurality of first semiconductor columns are arranged in an array in a first direction and a second direction. Each first semiconductor column includes a first part and a second part located on the first part. The second part includes a bottom portion, an intermediate portion and a top portion that are stacked successively. The first direction and the second direction intersect with each other and are both parallel to a top surface of the substrate.

The storage structure surrounds sidewalls of the first parts.

The first protective layer surrounds sidewalls of the top portions of the second parts.

A channel structure of each transistor is located in the intermediate portion of the second part, and an extending direction of the channel structure is the same as an extending direction of the second part.

According to another aspect of the disclosure, there is provided a memory, including at least one semiconductor structure described in any one of the above solutions of the disclosure.

According to still another aspect of the disclosure, there is provided a method for manufacturing a semiconductor structure. The method includes the following operations.

A substrate is provided, and a plurality of first semiconductor columns that are arranged in an array in a first direction and a second direction are formed on the substrate. Each first semiconductor column includes a first part and a second part located on the first part. The second part includes a bottom portion, an intermediate portion and a top portion that are stacked successively. The first direction and the second direction intersect with each other and are both parallel to a top surface of the substrate.

A storage structure surrounding sidewalls of the first parts is formed.

A first protective layer surrounding sidewalls of the top portions of the second parts is formed.

Transistors are formed. A channel structure of each transistor is located in the intermediate portion of the second part, and an extending direction of the channel structure is the same as an extending direction of the second part.

DETAILED DESCRIPTION

Figure 1:
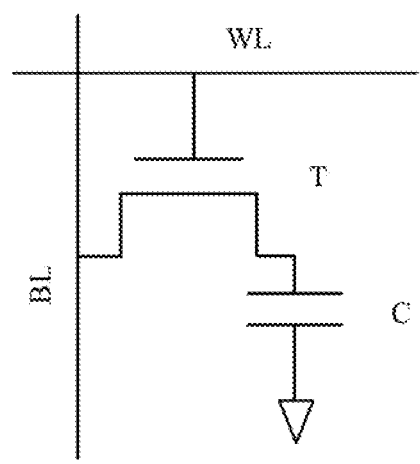
FIG. 1 is a schematic diagram of circuit connection of a DRAM transistor according to an embodiment of the disclosure.

In order to make technical solutions and advantages of the embodiments of the disclosure clearer, the technical solutions of the disclosure are further described in detail below with reference to the drawings and embodiments. Although the exemplary implementation methods of the disclosure are shown in the drawings, it should be understood that the disclosure may be implemented in various forms and should not be limited by the implementations described here. On the contrary, these embodiments are provided for a more thorough understanding of the disclosure, and to fully convey the scope of the disclosure to a person skilled in the art.

The disclosure is described in more detail by means of examples below with reference to the drawings. The advantages and features of the disclosure will become clearer from the following description and the claims. It is to be noted that all the drawings are in a very simple form and in an inaccurate scale, and are merely for the purpose of assisting in illustrating the embodiments of the disclosure conveniently and clearly.

It is understandable that the meaning of "on", "over" and "above" in the disclosure should be interpreted in the broadest possible way, so that "on" means not only that an object is on something without intermediate features or layers therebetween (that is, the object is directly on something), but also that an object is on something with intermediate features or layers therebetween.

In addition, for ease of description, the terms relating to relative space relations, such as "on", "over", "above", "upper" and "upper portion" etc. may be used in the disclosure to describe the relation between an element or feature and another element or feature as shown in the accompanying drawings. In addition to the orientations described in the drawings, the terms relating to relative space relations are intended to cover different orientations of a device in use or operation. An apparatus may be oriented in other ways (rotated 90 degrees or in other orientations), and the description words relating to relative space relations used in the disclosure may also be explained accordingly.

In the embodiments of the disclosure, the term "substrate" refers to a material on which subsequent material layers are added. The substrate itself may be patterned. The material added to the top of the substrate may be patterned or may remain unpatterned. In addition, the substrate may include a variety of semiconductor materials, such as silicon, silicon germanium, germanium, gallium arsenide, and indium phosphide or the like. Alternatively, the substrate may be made of a non-conductive material, such as glass, plastic, or sapphire wafer.

In the embodiments of the disclosure, the term "layer" refers to a material portion that includes an area with a thickness. The layer may extend over the whole of a lower or upper structure, or may have a range smaller than the range of the lower or upper structure. Moreover, the layer may be an area of a homogeneous or heterogeneous continuous structure of which thickness is less than that of a continuous structure. For example, the layer may be between the top surface and the bottom surface of the continuous structure, or the layer may be between any horizontal surface pair at the top surface and bottom surface of the continuous structure. The layer may extend horizontally, vertically and/or along an inclined surface. The layer may include a plurality of sub-layers. For example, an interconnection layer may include one or more conductors and contact sub-layers (in which interconnection wires and/or through-hole contacts are formed), and one or more dielectric sub-layers.

In the embodiments of the disclosure, the terms "first", "second" and the like are used for distinguishing similar objects rather than describing a specific sequence or a precedence order.

A semiconductor structure involved in the embodiments of the disclosure is at least a portion that will be used in the subsequent processing to form a final device structure. Herein, the final device may include a memory. The memory includes, but is not limited to, DRAM. The DRAM is only used as an example for description below.

It is to be noted that, the description about the DRAM in the following embodiments is only used for illustrating the disclosure, but not for limiting the scope of the disclosure.

With the development of the DRAM technology, the size of a storage unit becomes smaller and smaller, and its array architecture changes from $8F^2$ to $6F^2$ to $4F^2$. In addition, based on the requirements for ions and leakage current in the DRAM, the architecture of the memory changes from a planar array transistor to a recess gate array transistor, from the recess gate array transistor to a buried channel array transistor, and then from the buried channel array transistor to a vertical channel array transistor.

In some embodiments of the disclosure, regardless of the planar array transistor, the recess gate array transistor, the buried array transistor or the vertical gate transistor, the DRAM is composed of a plurality of storage unit structures. Each storage unit structure is mainly composed of one transistor and one storage unit (storage capacitor) controlled by the transistor. That is, the DRAM includes the architecture of one transistor (T) and one capacitor (C) (1T1C); and its main working principle is to use the amount of charges stored in the capacitor to represent whether a binary bit is 1 or 0.

FIG. 1 is a schematic diagram of a circuit connection using the architecture of 1T1C according to an embodiment of the disclosure. As shown in FIG. 1, the drain of the transistor T is electrically connected to a Bit Line (BL), the source of the transistor T is electrically connected to one electrode plate of the capacitor C, the other electrode plate of the capacitor C may be connected to a reference voltage which may be a ground voltage or other voltages, and the gate of the transistor T is connected to a Word Line (WL). The voltage is applied through the WL to control the transistor T to be turned on or off. The BL is configured to perform a read or write operation on the transistor T when the transistor T is turned on.

However, with the development of the memory, the sine of the DRAM continuously decreases, and manufacturing process steps of the memory become various, resulting in a high cost of the manufacturing process.

Figure 2:
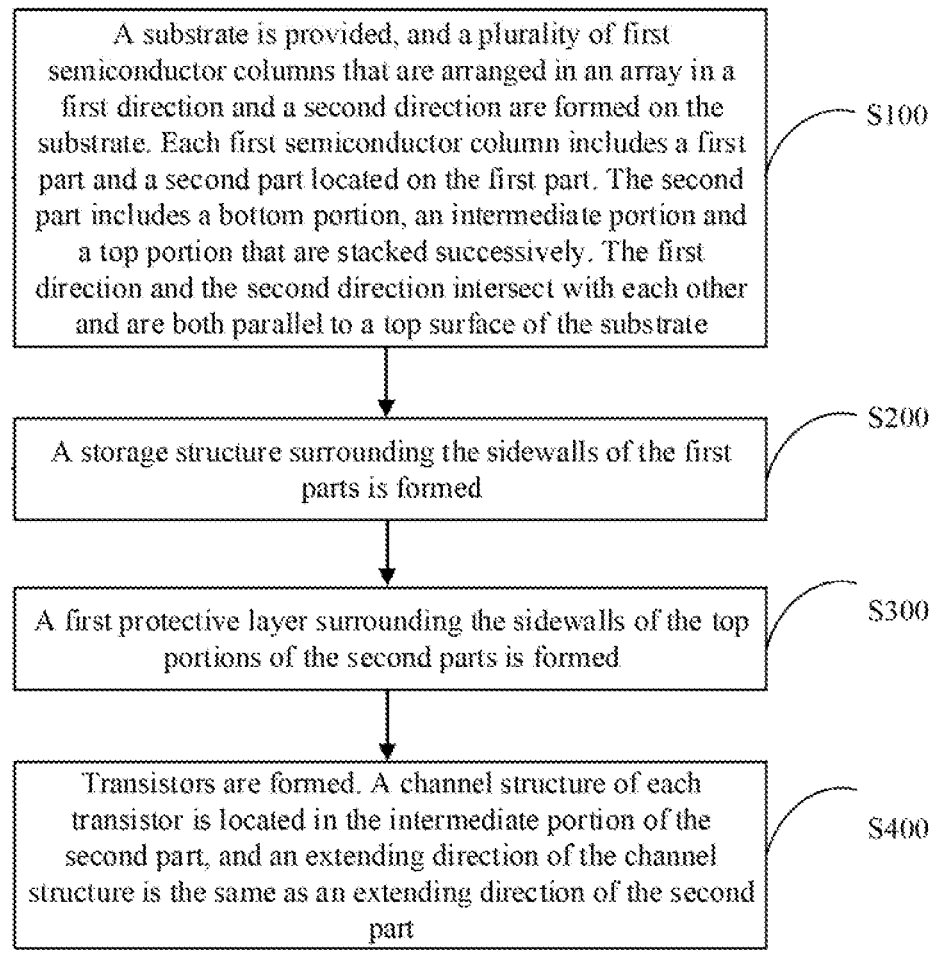
FIG. 2 is a schematic flowchart of a method for manufacturing a semiconductor structure according to an embodiment of the disclosure.

Based on this, in order to resolve one or more of the above problems, an embodiment of the disclosure provides a method for manufacturing a semiconductor structure, which can simply process steps. FIG. 2 is a schematic flowchart of a method for manufacturing a semiconductor structure according to an embodiment of the disclosure. As shown in FIG. 2, the method for manufacturing a semiconductor structure provided in this embodiment of the disclosure includes the following operations.

At S100, a substrate is provided, and a plurality of first semiconductor columns that are arranged in an array in a first direction and a second direction are formed on the substrate. A first semiconductor column includes a first pan and a second part located on the first part. The second part includes a bottom portion, an intermediate portion and a top portion that are stacked successively. The first direction and the second direction intersect with each other and are both parallel to a top surface of the substrate.

At S200, a storage structure surrounding sidewalls of the first pan is formed.

At S300, a first protective layer surrounding sidewalls of the top portion of the second part is formed.

At S400, a transistor is formed. A channel structure of the transistor is located in the intermediate portion of the second part, and an extending direction of the channel structure is the same as an extending direction of the second pan.

It should be understood that, the steps shown in FIG. 2 are not exclusive, and additional steps may also be performed before and after any step or between any steps in the shown operations. The sequence of the steps shown in FIG. 2 may be adjusted according to actual requirements. FIG. 3 to FIG. 26 are schematic cross-sectional views of a process for manufacturing a semiconductor structure according to an embodiment of the disclosure. It is to be noted that, FIG. 3 to FIG. 26 are a complete schematic diagram of an implementation process that reflects a method for manufacturing a semiconductor structure. Unmarked portions in some drawings can be shared with each other. The method for manufacturing a semiconductor structure provided in this embodiment of the disclosure is further described in detail below with reference to FIG. 2, FIG. 3 to FIG. 26.

At S100, mainly, a substrate is provided and the plurality of first semiconductor columns are formed on the substrate.

In some embodiments, the forming the first semiconductor columns includes the following operations.

A semiconductor base is provided.

A plurality of first trenches that are spaced in the first direction are formed in the semiconductor base, and a third insulation layer is formed in the first trenches and a surface of the semiconductor base.

The semiconductor base and the third insulation layer are etched to form a plurality of second trenches that are spaced in the second direction. A bottom surface of the first trench is lower than a bottom surface of the second trench. The semiconductor base is divided into the plurality of first semiconductor columns by the first trenches and the second trenches.

In some embodiments, the method further includes: forming second protective layers on sidewalls of each of the second trenches.

The semiconductor base at a bottom of the second trench is etched, to form an enlarged third trench. A bottom surface of the third trench is flush with the bottom surface of the first trench.

A plurality of second semiconductor columns are formed between adjacent third trenches. Each of the first semiconductor columns is located on one corresponding second semiconductor column. A maximum diameter width of the second semiconductor column in the second direction is less than a minimum diameter width of the first semiconductor column.

The second semiconductor column is oxidized, to cause the second semiconductor column to be completely oxidized into an oxidation column.

In some embodiments, the method further includes: filling a sacrificial material in the second trench after the second protective layers are formed.

The third insulation layer, the second protective layers and the sacrificial material that are located above the first semiconductor columns are removed.

A plurality of first support material layers that are spaced in the first direction and extend in the second direction are formed on the top surfaces of the first semiconductor columns.

The remaining sacrificial material is removed, and the semiconductor base is etched along the bottom of the second trench.

In some embodiments, the method further includes: filling first oxide layers between the first support material layers, between the second protective layers, and between the oxidation columns.

Partial first support material layer and partial first oxide layer above the top surface of the first semiconductor columns are removed, so as to form a plurality of third grooves extending in the first direction. The remaining first support material layers constitute a first support layer.

A second support layer is formed in the third groove. The first support layer and the second support layer jointly constitute a grid-like top support layer.

A process for forming the first semiconductor columns is described in detail below with reference to FIG. 3 to FIG. 14.

Figure 3:
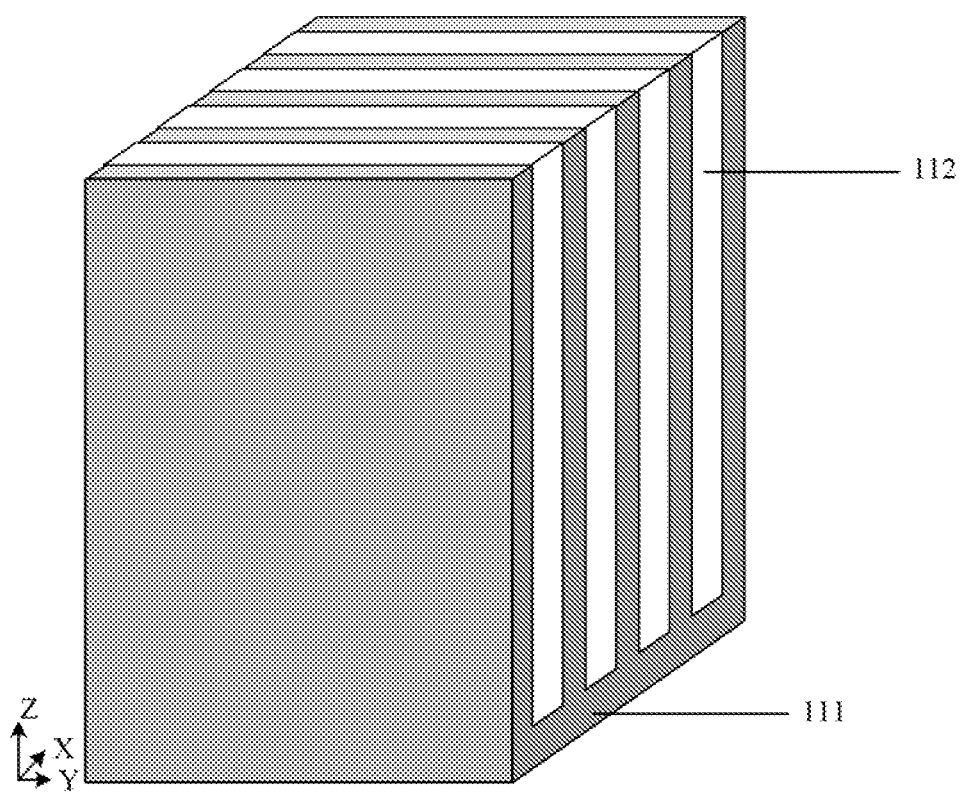
FIG. 3 to FIG. 26 are schematic cross-sectional views of a process for manufacturing a semiconductor structure according to an embodiment of the disclosure.

As shown in FIG. 3, the semiconductor base 111 is provided, and the plurality of first trenches 112 are formed in the semiconductor base 111.

In some specific examples, the first semiconductor base 111 includes a substrate. The substrate may include a monoatomic semiconductor material substrate (for example, a Silicon (Si) substrate, a germanium (Ge) substrate, and the like), a compound semiconductor material substrate (for example, a silicon germanium (SiGe) substrate), a Silicon-On-Insulator (SOI) substrate, a Germanium-On-Insulator (GeOI) substrate, and the like. Preferably, the substrate is a Si substrate.

In some specific examples, a surface of the semiconductor base 111 is etched to the plurality of first trenches 112 spaced in the first direction in the semiconductor base 111. Herein, each of the first trenches 112 extends in the second direction.

Herein, the first direction is parallel to the surface of the substrate. The second direction intersects with the first direction, and is parallel to the surface of the substrate.

Herein, that the first direction intersects with the second direction can be understood as that an included angle between the first direction and the second direction ranges from 0 to 90 degrees.

For clear description of the disclosure, in the following embodiments, that the first direction is perpendicular to the second direction is used as an example for description.

Exemplarily, the first direction is an X-axis direction shown in FIG. 3; and the second direction is a Y-axis direction shown in FIG. 3. The description about directions in the following embodiments is only used for illustrating the disclosure, but not for limiting the scope of the disclosure.

In some specific examples, the first trench 112 includes, but is not limited to, a Shallow Trench Isolation (STI) structure.

In some specific examples, a method for forming the first trenches 112 includes, but is not limited to, a dry plasma etching process.

Figure 4:
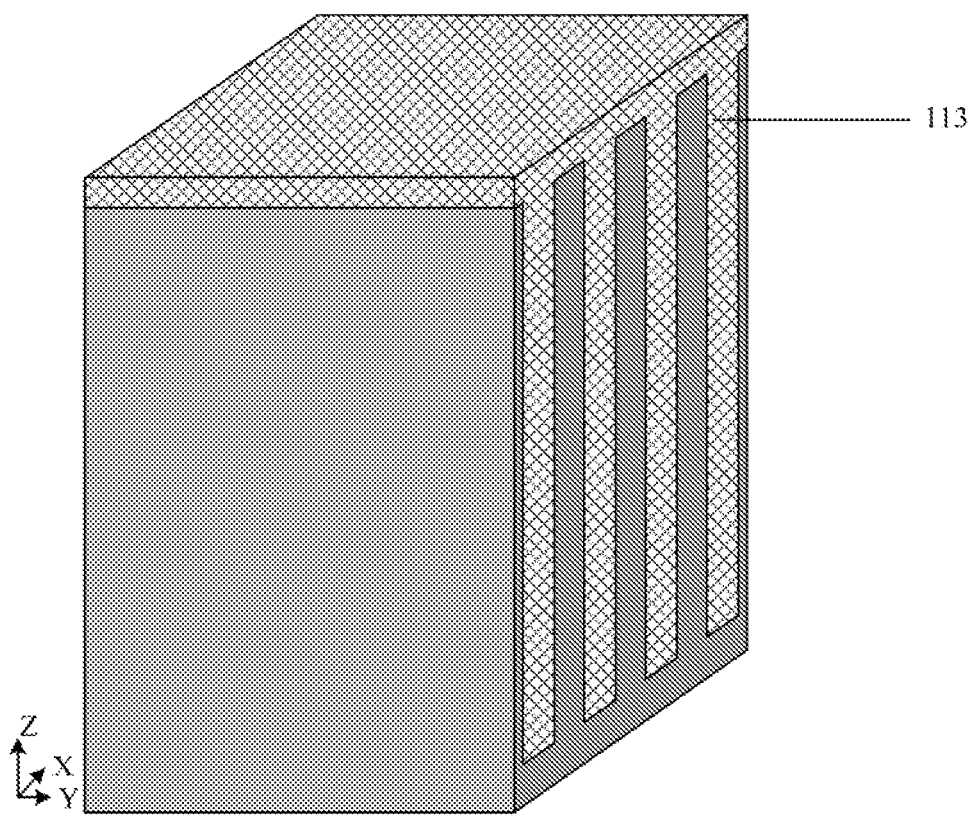

As shown in FIG. 4, a third insulation layer 113 is formed in the first trenches 112 and on a surface of the semiconductor base 111.

It is understandable that, by forming the third insulation layer 113 on the surface of the semiconductor base 111, the follow-up processes can be prevented from causing certain consumption to the top surface of the semiconductor base 111.

Herein, the third insulation layer 113 formed in the first trenches 112 may be configured to achieve a supporting effect.

In some specific examples, a constituent material of the third insulation layer 113 includes, but is not limited to silicon oxide ($SiO_2$).

In some specific examples, the method for forming the third insulation layer 113 includes, but is not limited to, a Physical Vapor Deposition (PVD) process, a Chemical Vapor Deposition (CVD) process, an Atomic Layer Deposition (ALD) process, and the like.

In some specific examples, the method further includes that after the third insulation layer 113 is formed, planarization is performed on the third insulation layer 113, to cause a surface of the third insulation layer 113 flat. Exemplarily, the planarization process includes, but is not limited to, Chemical Mechanical Polishing (CMP).

Figure 5:
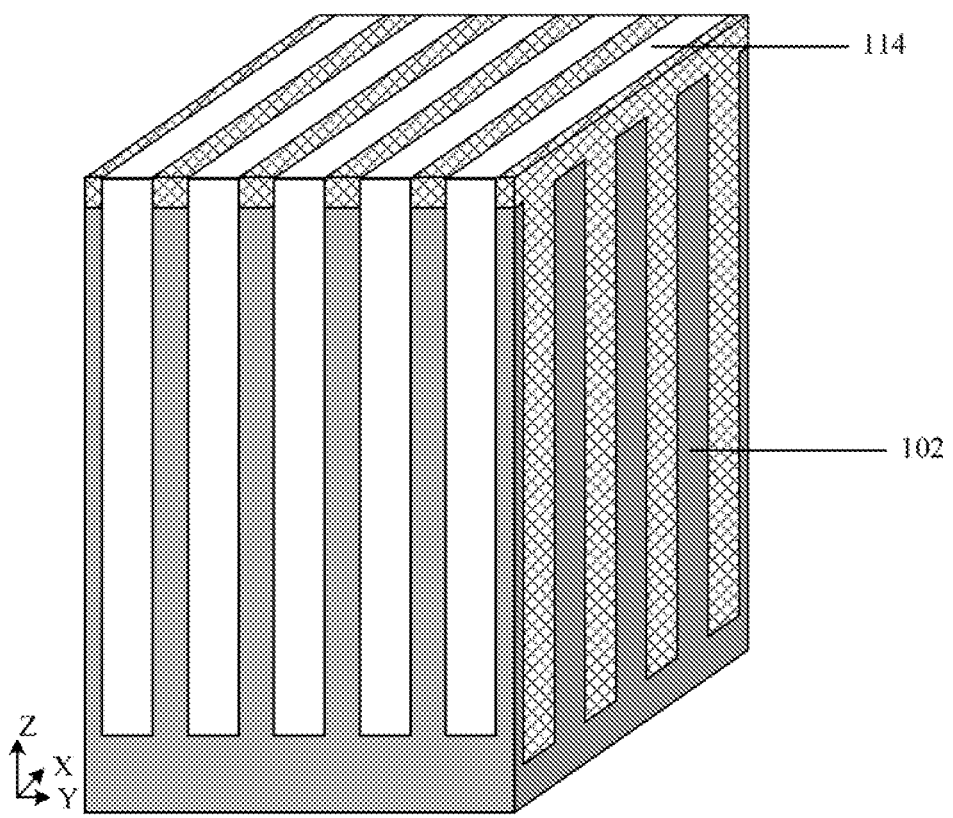

Next, as shown in FIG. 5, the semiconductor base 111 and the third insulation layer 113 are etched to form a plurality of second trenches 114 that are spaced in the second direction. A bottom surface of the first trench 112 is lower than a bottom surface of the second trench 114. The semiconductor base 111 is divided into the plurality of first semiconductor columns 102 by the first trenches 112 and the second trenches 114.

Herein, each of the second trenches 114 extends in the first direction. That is to say, the first trench 112 intersects with the second trench 114.

In some specific examples, when the first direction is perpendicular to the second direction, the first trench 112 is perpendicular to the second trench 114.

In some specific examples, the plurality of first trenches 112 spaced in the X-axis direction, and each of the first trenches 112 extends in the Y-axis direction. The plurality of second trenches 114 spaced in the Y-axis direction, and each of the second trenches 114 extends in the X-axis direction.

In some specific examples, a method for forming the second trenches 114 includes, but is not limited to, a dry plasma etching process.

In some specific examples, the second trench 114 includes, but is not limited to, an STI structure.

Herein, the semiconductor base 111 is divided into the plurality of first semiconductor columns 102 arranged in an array in the first direction and the second direction by the first trenches 112 and the second trenches 114.

In some specific examples, the method for etching the semiconductor base 111 and the third insulation layer 113 includes, but is not limited to, a dry etching process.

Herein, when the semiconductor base 111 and the third insulation layer 113 are etched to form the first semiconductor columns 102, the third insulation layer 113 on the top surface of the first semiconductor column 102 is reserved.

It is understandable that, herein, the third insulation layer 113 on the top surface of the first semiconductor column 102 is configured to protect the top surface of the first semiconductor column 102, so as to prevent the follow-up processes from causing certain consumption to the top surface of the first semiconductor column 102.

Figure 6:
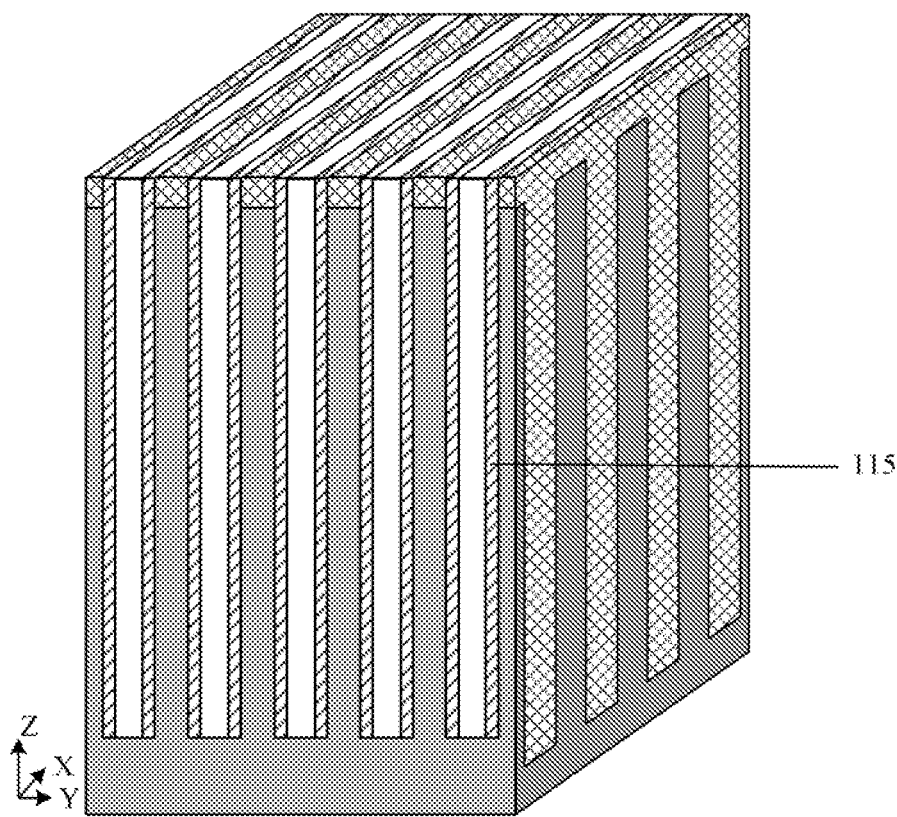

Next, as shown in FIG. 6, second protective layers 115 are formed on sidewalls of each of the second trenches 114.

In the embodiments of the disclosure, two solutions for forming the second protective layers 115 on the sidewalls of each of the second trenches 114 are provided.

Solution I, the operation of forming the second protective layers 115 on the sidewalls of each of the second trenches 114 includes the following operations.

By means of selective atomic layer deposition, a second protective material layer is formed on the sidewalls and bottom wall of each of the second trenches 114.

The second protective material layer on the bottom wall of the second trench 114 is removed to form the second protective layers 115.

In some specific examples, the method for removing the second protective material layer on the bottom wall of the second trench 114 includes, but is not limited to, a method of removing with diluted hydrofluoric acid.

Solution II, the operation of forming the second protective layers 115 on the sidewalls of each of the second trenches 114 includes: first filling the second protective material layer in the second trench 114; then etching back partial second protective material layer to reserve the second protective material layer on the sidewalls of the second trench 114, so as to form the second protective layers 115.

In some specific examples, the method for filling the second protective material layer in the second trench 114 includes, but is not limited to, PVD and CVD.

In some specific examples, a material of the second protective layer 115 includes, but is not limited to, silicon nitride.

It is understandable that, herein, the second protective layers 115 formed on the sidewalls of the second trench 114 play a role of protecting the first semiconductor column 102, so that the first semiconductor column 102 is prevented from being also oxidized when a second semiconductor column 117 is oxidized in the follow-up process.

Figure 7:
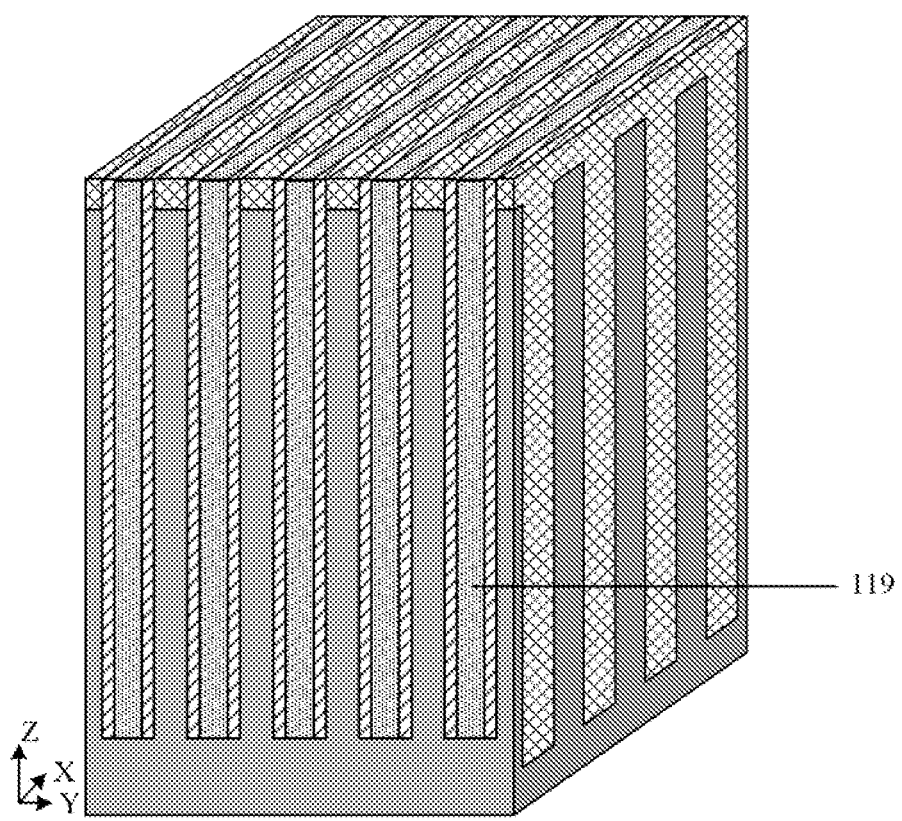

Next, as shown in FIG. 7, a sacrificial material 119 is filled in the second trench 114. Specifically, the sacrificial material 119 is filled in the second trench 114 in which the second protective layers 115 are formed.

Herein, for the selection of the sacrificial material 119, it is required to be considered that the material needs to have a certain selection ratio with a material of the second protective layer 115, a material of the third insulation layer 113 and a material of the top support layer 120, so that, when the sacrificial material 119 is removed in the follow-up process, the impact on the second protective layer 115, the third insulation layer 113 and the top support layer 120 is relatively small.

In some specific examples, the sacrificial material 119 includes, but is not limited to, carbon.

Figure 8:
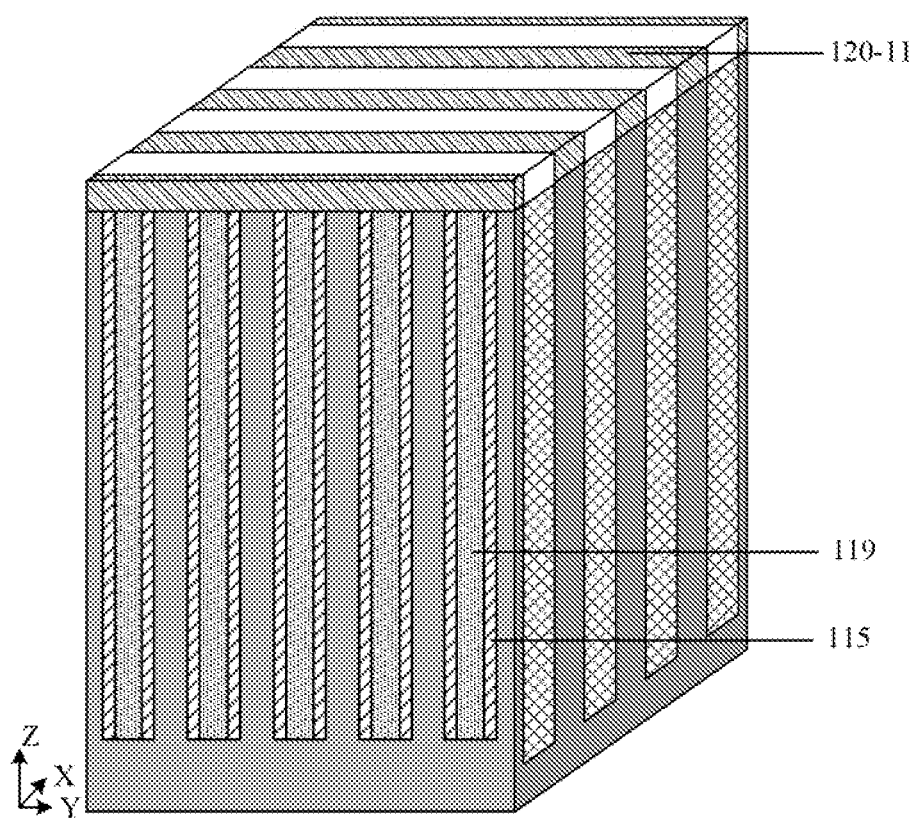

Next, as shown in FIG. 8, the third insulation layer 113, the second protective layers 115 and the sacrificial material 119 that are located above the first semiconductor columns 102 are removed, and a plurality of first support material layers 120-1 that are spaced in the first direction and extend in the second direction are formed on the top surfaces of the first semiconductor columns 102.

Herein, the first support material layer 120-11 may serve as a part of the top support layer 120 formed in the follow-up process, and plays a role of supporting the first semiconductor column 102.

Figure 9:
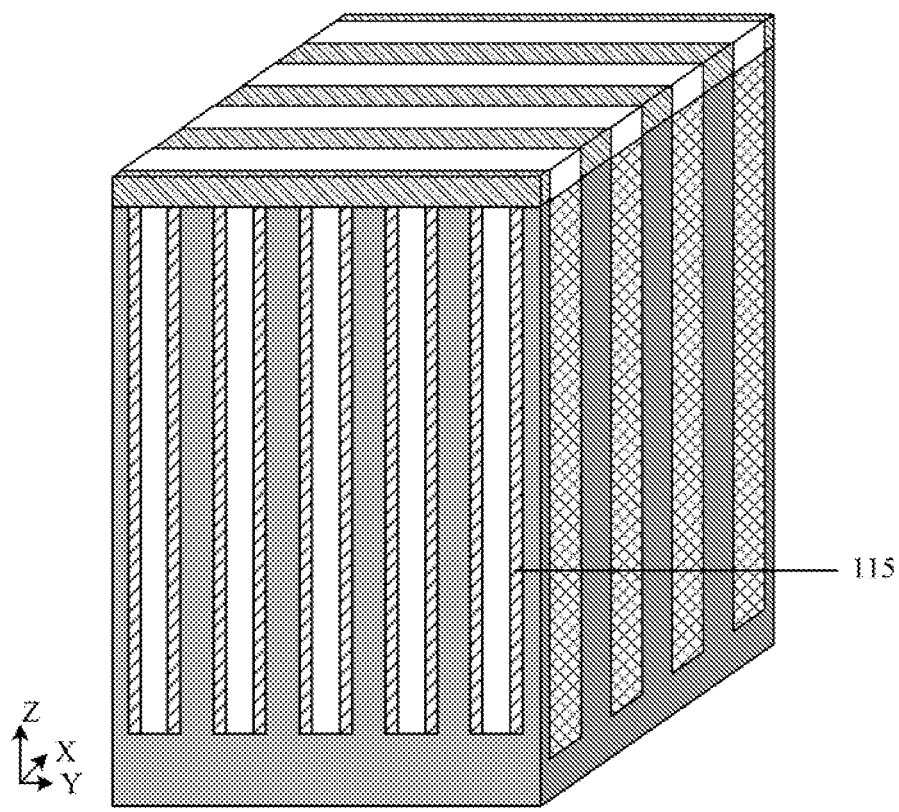

Next, as shown in FIG. 9, the remaining sacrificial material 119 is removed, to expose a sidewall of the second protective layer 115 and the surface of the semiconductor base 111 in the second trench 114.

In some specific examples, the method for removing the remaining sacrificial material 119 includes, but is not limited to, a dry etching process and a wet etching process.

Figure 10:
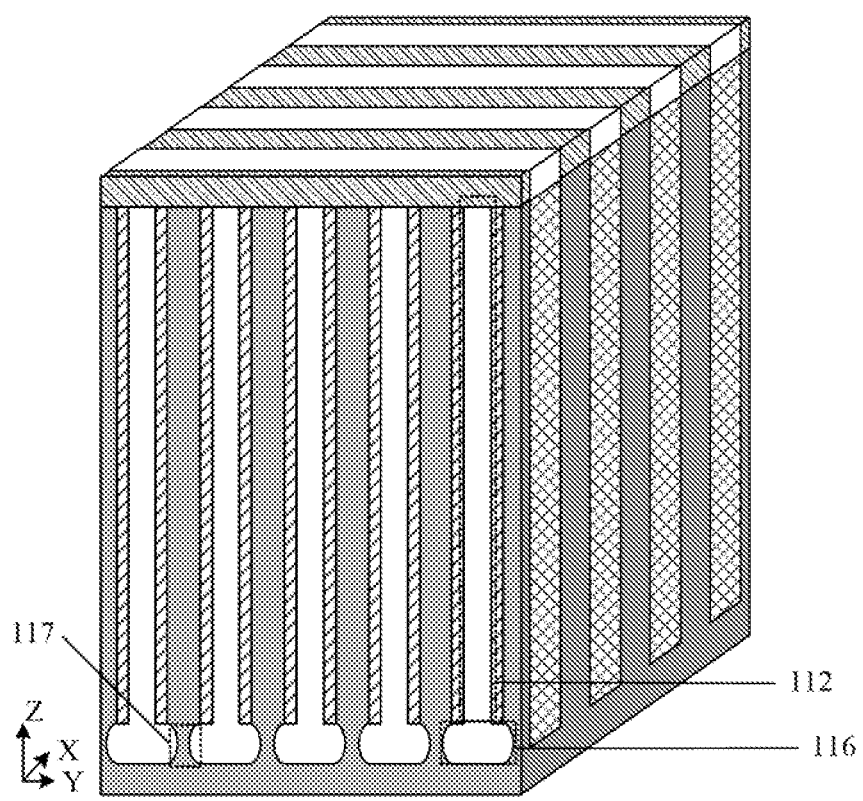

Next, as shown in FIG. 10, the semiconductor base 111 is etched along the bottom portion of the second trench 114, to form an enlarged third trench 116 (shown in the dotted box in FIG. 10). A bottom surface of the third trench 116 is flush with the bottom surface of the first trench 112.

It is to be noted that, being substantially flush involved in the disclosure may be understood as being approximately flush. It is understandable that, during the manufacturing of a memory, the unaligned or un-flush caused by a process error is also included in the scope of being substantially flush.

Herein, that the semiconductor base 111 is etched along the bottom portion of the second trench 114 may be understood that, the bottom portion of the second trench 114 is etched in the second direction, so that a diameter width of the formed third trench 116 in the second direction is greater than a diameter width of the second trench 114 in the second direction.

In some specific examples, the used etching process may include a wet etching process, a dry etching process, and the like.

Exemplarily, in the wet etching process, an etchant is introduced into the bottom portion of the second trench 114. By means of anisotropic etching of the etchant, the diameter width of the bottom portion of the second trench 114 in the Y-axis direction is increased, so as to form the third trench 116.

Exemplarily, in the dry etching process, by controlling plasma to perform lateral etching, the third trench 116 with the expanded diameter width is formed at the bottom portion of the second trench t 114.

Herein, a cross-sectional shape of the formed third trench 116 includes, but is not limited to, a bowl shape shown in FIG. 10.

While the third trench 116 is formed, a plurality of second semiconductor columns 117 are formed between adjacent third trenches 116. Each first semiconductor column 102 is located on one corresponding second semiconductor column 117. A maximum diameter width of the second semiconductor column 117 in the second direction is less than a minimum diameter width of the first semiconductor column 102.

Exemplarily, the maximum diameter width of the second semiconductor column 117 in the second direction may be understood as a diameter width in the second direction at a contact position between the second semiconductor column 117 and the first semiconductor column 102 in FIG. 10. The minimum diameter width of the first semiconductor column 102 may be understood as an area of the first semiconductor column 102 with the minimum size in the second direction. Referring to FIG. 10, sizes of upper and lower portions of the first semiconductor column 102 in the second direction are the same. That is to say, the minimum diameter width and the maximum diameter width of the first semiconductor column 102 are the same.

Figure 11:
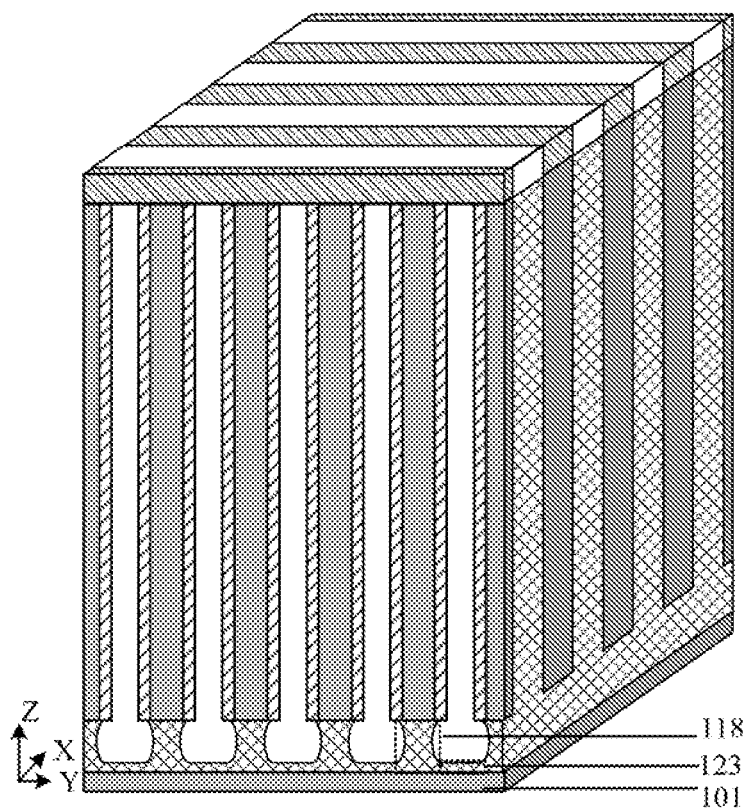

Next, as shown in FIG. 11, the second semiconductor column 117 is oxidized, to cause the second semiconductor column 117 to be completely oxidized into an oxidation column 118 (shown in the dotted box in FIG. 11).

Herein, each first semiconductor column 102 is located on a top surface of one oxidation column 118.

It is to be noted that, when the second semiconductor column 117 is oxidized, the semiconductor base 111 between adjacent second semiconductor columns 117 is also be oxidized into a second oxide layer 123 (shown in the dotted box in FIG. 11). The second oxide layer 123 here and the first oxide layer 121 filled between the oxidation columns 118 in the follow-up process jointly play a role of isolating the storage structure formed in the follow-up process and the substrate, so that the electric leakage of the storage structure can be alleviated.

After the second semiconductor column 117 is oxidized, the remaining semiconductor base 111 located under the oxidation columns 118 and the second oxide layers 123 constitutes the substrate 101 (shown in the dotted box in FIG. 11).

Figure 12:
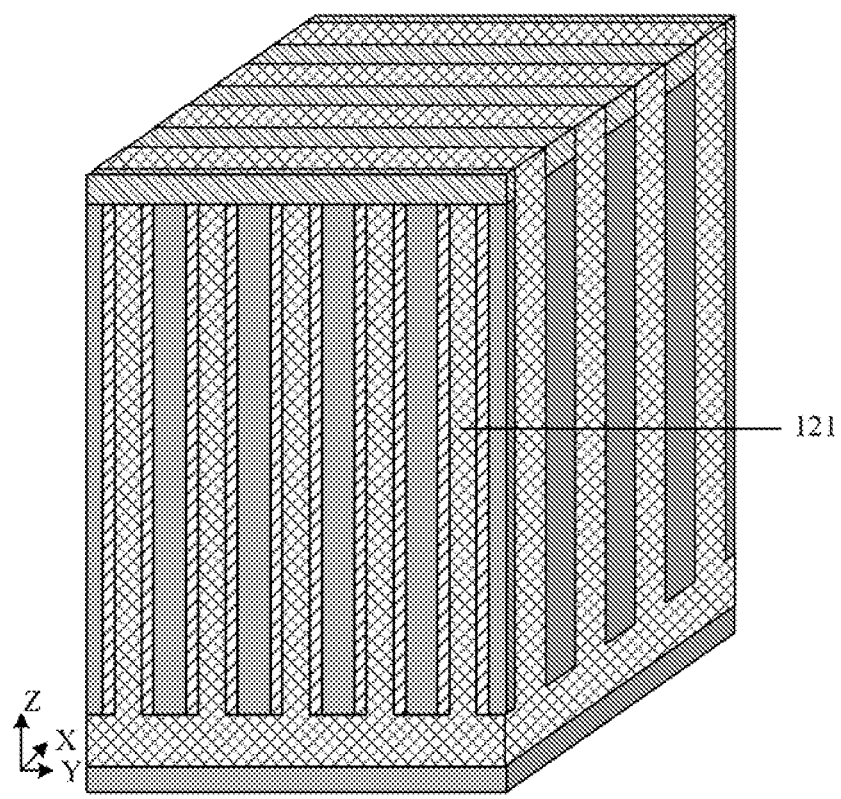

Next, as shown in FIG. 12, the first oxide layers 121 are filled between the first support material layers 120-11, between the second protective layers 115, and between the oxidation columns 118.

In some specific examples, the material of the first oxide layer 121 includes, but is not limited to, silicon oxide.

In some specific examples, the method for filling the first oxide layer 121 includes, but is not limited to, PVD, CVD, and ALD.

Figure 13:
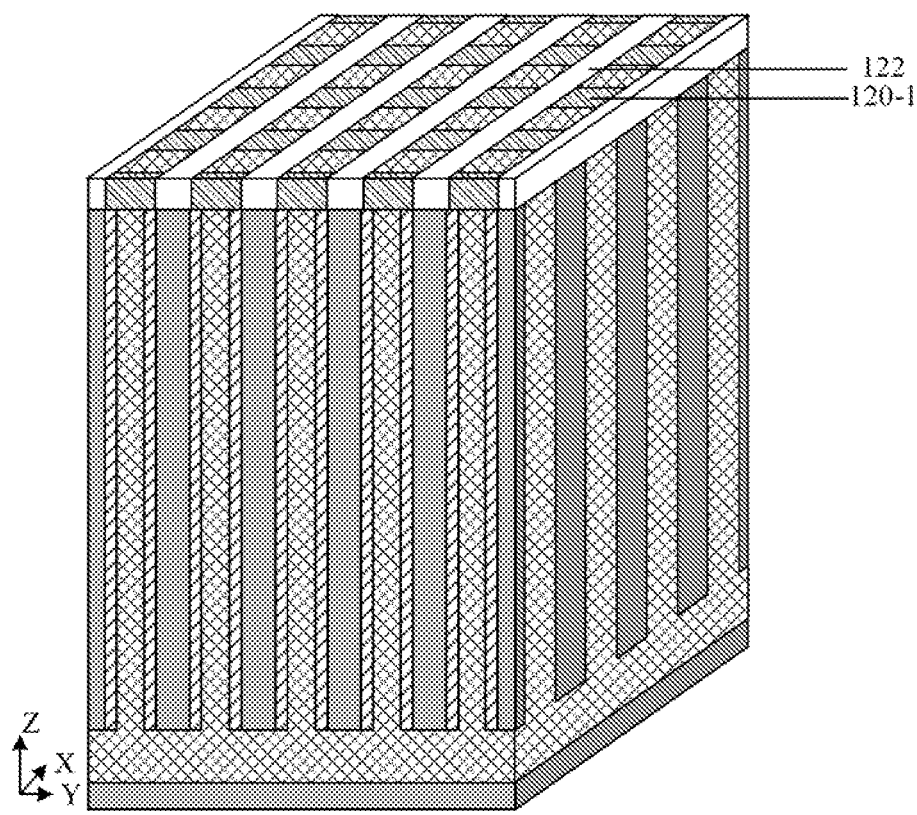

Next, as shown in FIG. 13, partial first support material layers 120-11 on the top surface of the first semiconductor columns 102 and partial first oxide layers 121 are removed, so as to form a plurality of third grooves 122 extending in the first direction. The remaining first support material layer 120-11 constitutes a first support layer 120-1.

In some specific examples, the method for removing partial first support material layers 120-11 and partial first oxide layers 121 includes, but is not limited to, a dry etching process and a wet etching process.

Figure 14:
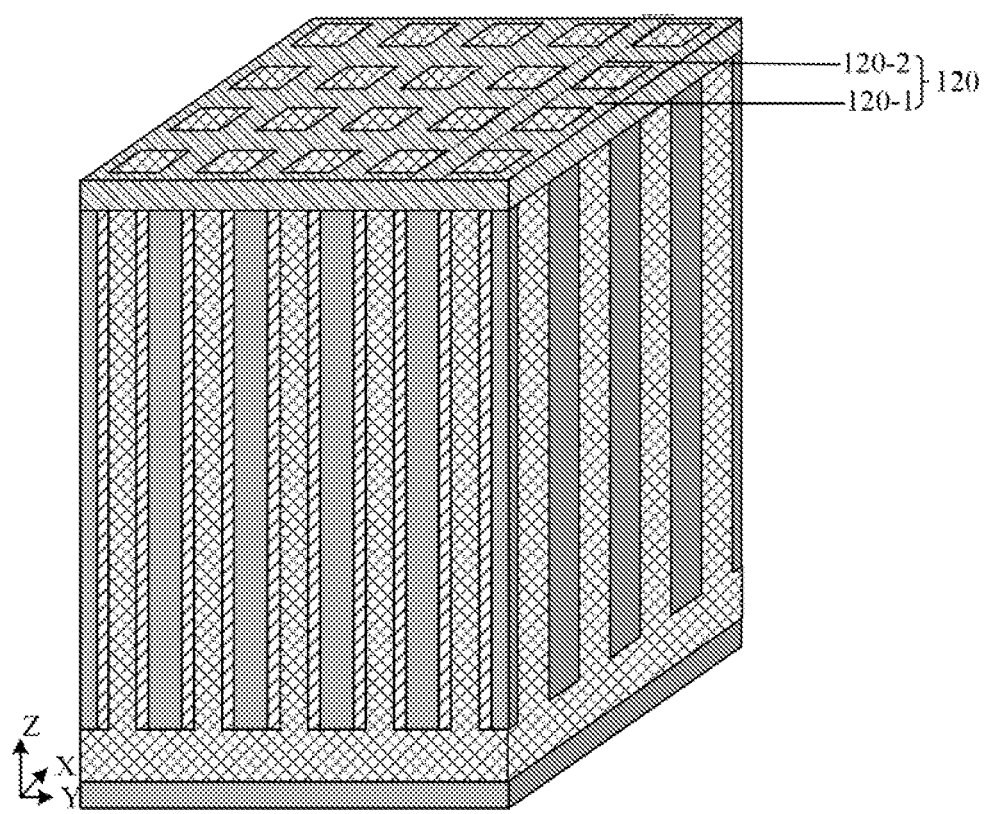

Next, as shown in FIG. 14, a second support layer 120-2 (shown in the dotted box in FIG. 14) is formed in the third groove 122. The first support layer 120-1 and the second support layer 120-2 jointly constitute the grid-like top support layer 120.

Herein, the top support layer 120 covers at least the top surface of partial first semiconductor column 102. It is understandable that, the top support layer 120 here is configured to support the first semiconductor column 102, so that the easy collapsing of the first semiconductor column 102 after the first oxide layers 121 and the second protective layers 115 between the first semiconductor columns 102 are removed in the follow-up process can be improved.

For the selection of materials of the first support layer 120-1 and the second support layer 120-2, in a first aspect, it is required to be considered that the materials of the first support layer 120-1 and the second support layer 120-2 need to have a certain etching selection ratio with the material of the second protective layer 115, so that, when the second protective layers 115 are removed, the impact on the first support layer 120-1 and the second support layer 120-2 can be reduced. In a second aspect, it is required to be considered that the materials of the first support layer 120-1 and the second support layer 120-2 need to have a certain etching selection ratio with the material of the first oxide layer 121, so that, when the first oxide layer 121 is removed, the impact on the first support layer 120-1 and the second support layer 120-2 can be reduced. In a third aspect, it is required to be considered that the material of the first support layer 120-1 needs to have a certain etching selection ratio with the sacrificial material 119, so that, when the sacrificial material 119 is removed, the impact on the material of the first support layer 120-1 can be reduced.

In some specific examples, the materials of the first support layer 120-1 and the second support layer 120-2 include, but are not limited to, polysilicon.

Herein, the first support layer 120-1 and the second support layer 120-2 may be made of the same material or different materials.

At S200, mainly, a storage structure surrounding the sidewalls of the first part is formed.

In some embodiments, the forming the storage structure includes the following operations.

Partial first oxide layer and the second protective layers are removed.

A first conductive material, a dielectric layer material and a second conductive material are successively filled between the first semiconductor columns.

The top support layer is removed, and the first conductive material, the dielectric layer material and the second conductive material between the second parts are removed by etching back. The first conductive material, the dielectric layer material and the second conductive material remaining between the first parts jointly constitute the storage structure.

A process for forming the storage structure is described in detail below with reference to FIG. 15 to FIG. 18.

Figure 15:
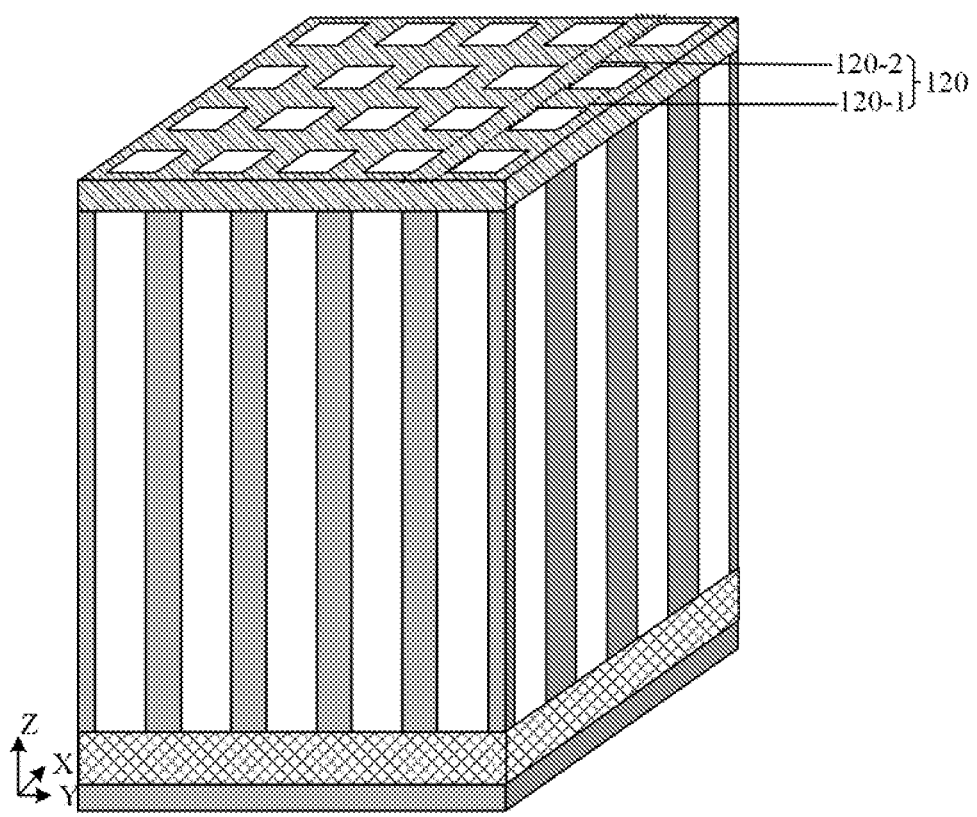

Firstly, as shown in FIG. 15, partial first oxide layer 121 and the second protective layers 115 are removed.

In some specific examples, the method for removing partial first oxide layer 121 and the second protective layers 115 includes, but is not limited to, a dry etching process and a wet etching process.

Herein, the removed first oxide layers 121 are the first oxide layers 121 between the first semiconductor columns 102 and between the top support layers 120, and the first oxide layer 121 between the oxidation columns 118 is reserved.

It is understandable that, the oxidation columns 118 and the first oxide layer 121 between the oxidation columns 118 here may isolate the storage structure formed in the follow-up process from the substrate, so that the electric leakage of the storage structure can be alleviated.

Figure 16:
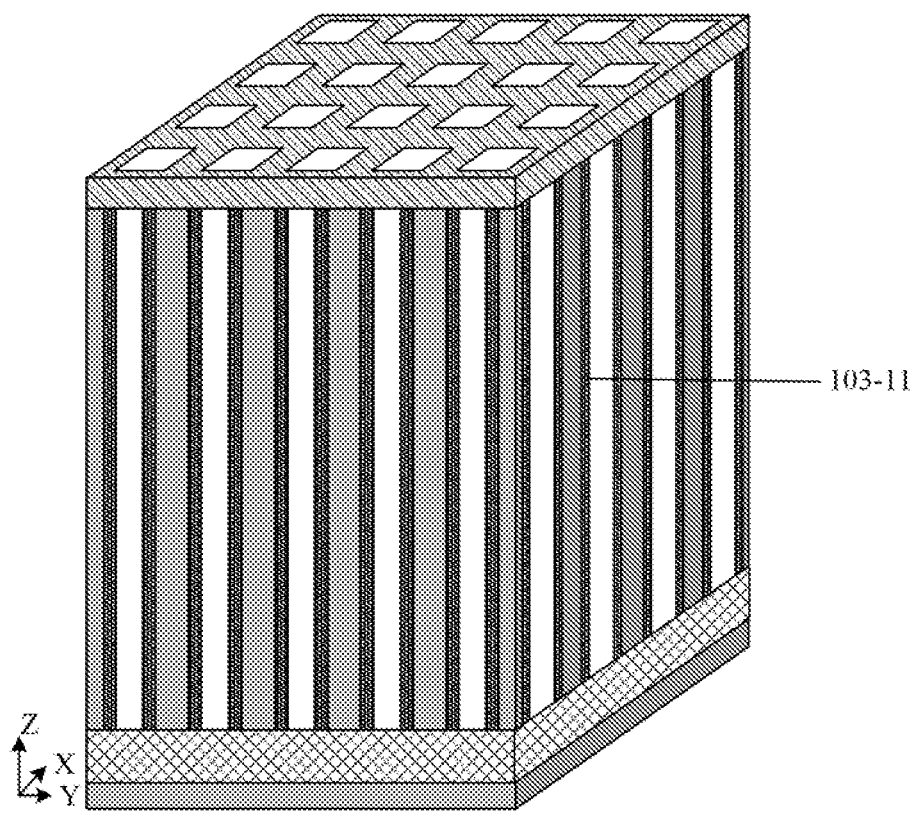

Next, as shown in FIG. 16, a first conductive material 103-11 is filled between the first semiconductor columns 102.

In some specific examples, the method for filling the first conductive material 103-11 includes, but is not limited to, processes such as PVD and CVD.

It is to be noted that, in the above embodiments, the method for filling the first conductive material 103-11 and filling a second conductive material 103-33 in the follow-up process may also be understood as that Conductive on Conductive (CoC) is formed by means of a selective deposition process. Herein, the selective deposition process includes, but is not limited to, ALD or the like.

In some specific examples, a constituent material of the first conductive material 103-11 may include, but is not limited to, ruthenium (Ru), ruthenium oxide (RuO), and titanium nitride (TiN).

Figure 17:
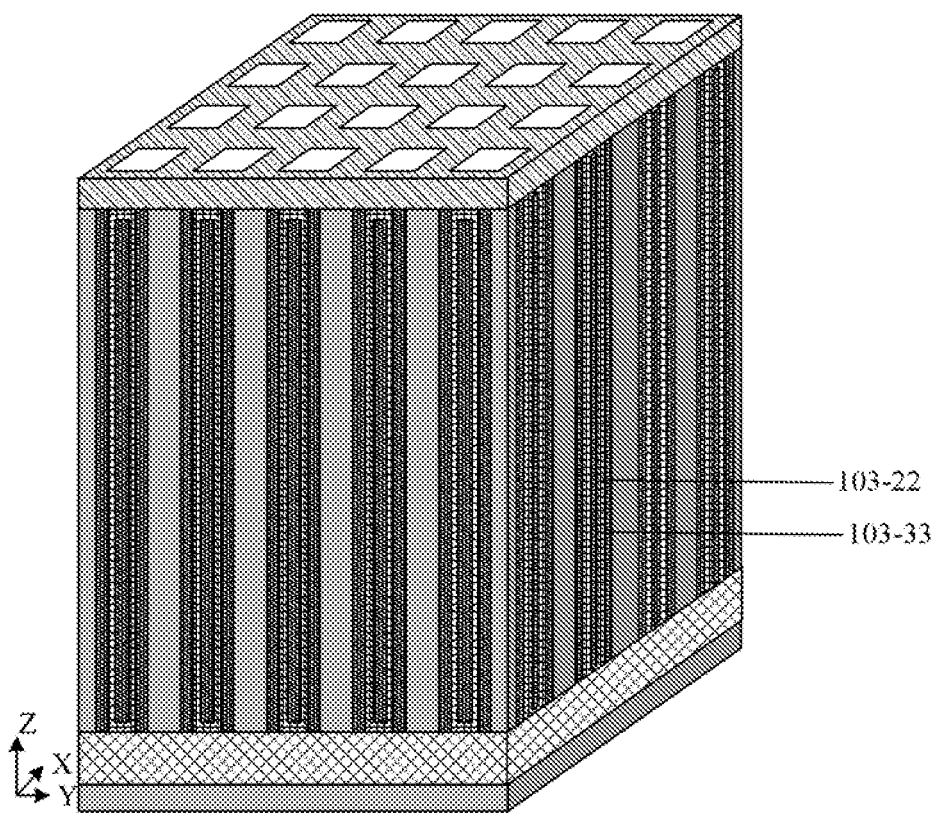

Next, as shown in FIG. 17, a dielectric layer material 103-22 and the second conductive material 103-33 are successively filled between the first conductive materials 103-11.

In some specific examples, the method for filling the first conductive material 103-11 includes, but is not limited to, processes such as PVD, CVD, and ALD.

Herein, a constituent material of the dielectric layer material 103-22 includes a high dielectric constant (High-K) material. The High-K material generally refers to a material with a dielectric constant higher than 3.9, and is generally significantly higher than the value. In some specific examples, a material of the dielectric layer material 103-22 may include, but is not limited to, alumina ($Al_2O_3$), zirconium oxide (ZrO), hafnium oxide ($HfO_2$), strontium titanate ($SrTiO_3$), and the like.

In some specific examples, the constituent material of the second conductive material 103-33 may include, but is not limited to. Ru, RuO, and TiN.

It is to be noted that, herein, when the first conductive material 103-11, the dielectric layer material 103-22 and the second conductive material 103-33 are filled between the first semiconductor columns 102, the first conductive material 103-11, the dielectric layer material 103-22 and the second conductive material 103-33 are not filled between the top support layers 120.

Figure 18:
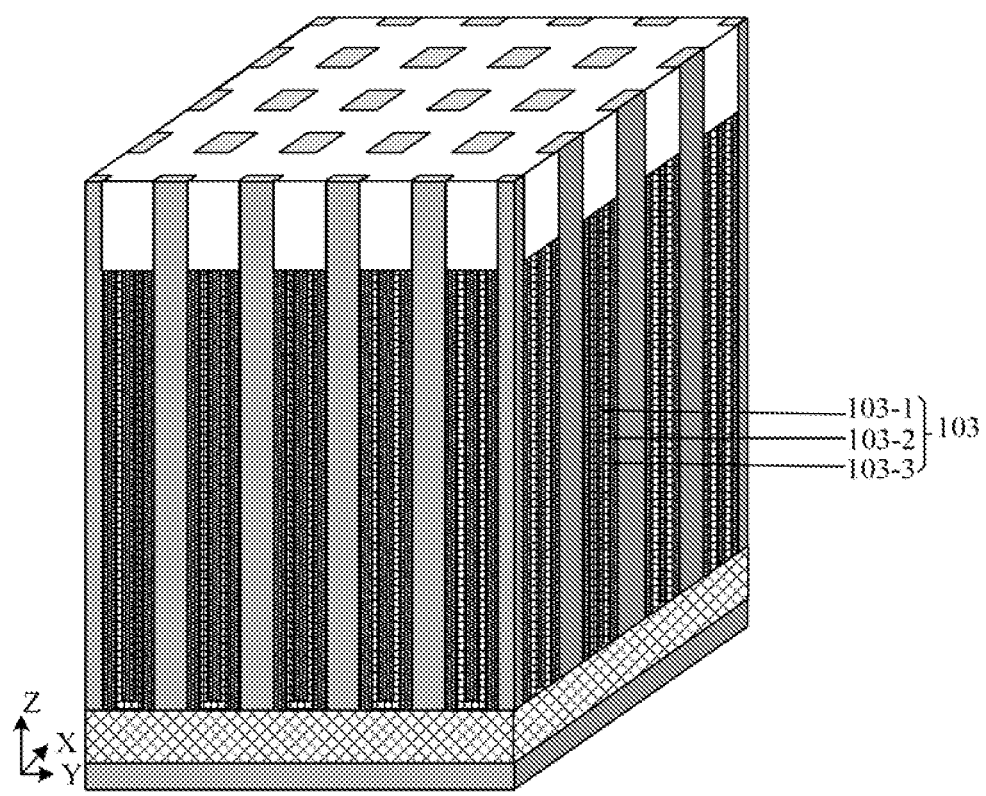

Next, as shown in FIG. 18, the top support layer 120 is removed, and the first conductive material 103-11, the dielectric layer material 103-22 and the second conductive material 103-33 between the second parts are removed by etching back. The first conductive material 103-11, the dielectric layer material 103-22 and the second conductive material 103-33 remaining between the first parts jointly constitute the storage structure 103.

In some specific examples, the method for removing the top support layer 120 includes, but is not limited to, a dry etching process and a wet etching process.

In some specific examples, the method for removing the first conductive material 103-11, the dielectric layer material 103-22 and the second conductive material 103-33 between the second parts includes, but is not limited to, a dry etching process and a wet etching process.

Herein, the first conductive material 103-11, the dielectric layer material 103-22 and the second conductive material 103-33 remaining between the first parts respectively constitute a first electrode layer 103-1, a dielectric layer 103-2 and a second electrode layer 103-3 of the storage structure 103.

Herein, the first electrode layer 103-1 is configured as a lower electrode of a capacitor; the dielectric layer 103-2 is configured as a dielectric of the capacitor; and the second electrode layer 103-3 is configured as an upper electrode of the capacitor.

At S300, mainly the first protective layer surrounding the sidewalls of the top portion of the second part is formed.

In some embodiments, the forming the first protective layer includes the following operations.

A first insulation layer is formed between the second parts.

Partial first insulation layer at the top portion of the second part is removed to form a plurality of first grooves. Two opposite sidewalls of the top portions of two adjacent first semiconductor columns in the first direction are exposed from each of the first grooves.

The first grooves are filled to form a plurality of first protective columns.

The remaining first insulation layer at the top portion of the second part is removed to form a plurality of second grooves that extend in the first direction. Two opposite sidewalls of the top portions of two adjacent first semiconductor columns in the second direction are exposed from each of the second grooves.

A plurality of second protective columns are formed on sidewalls of the second grooves. The first protective columns and the second protective columns jointly constitute the first protective layer.

A process for forming the first protective layer is described in detail below with reference to FIG. 19 to FIG. 23.

Figure 19:
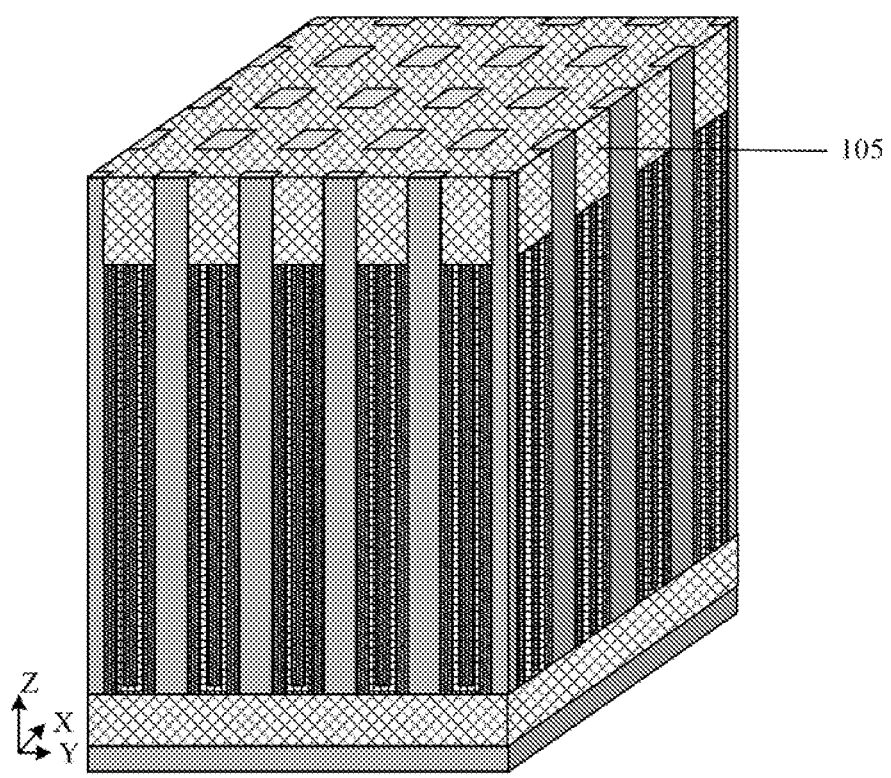

Firstly, as shown in FIG. 19, a first insulation layer 105 is formed between the second parts.

In some specific examples, the method for forming the first insulation layer 105 includes, but is not limited to, PVD, CVD, and ALD.

In some specific examples, a material of the first insulation layer 105 includes, but is not limited to silicon oxide.

Figure 20:
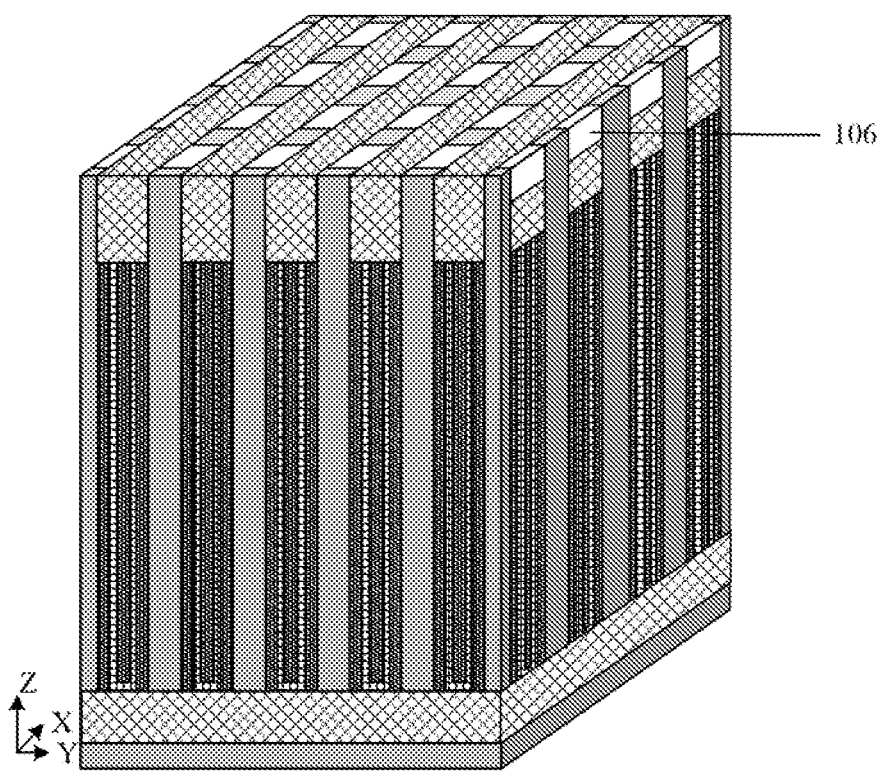

Next, as shown in FIG. 20, partial first insulation layer 105 at the top portion of the second part is removed to form a plurality of first grooves 106.

In some specific examples, a mask layer may be formed on the first insulation layer 105 and the first semiconductor columns 102. A defined pattern is formed in the mask layer. The first insulation layer 105 is etched by the mask layer to remove the partial first insulation layer 105 between the top portions of the second parts, so as to obtain the first grooves 106.

In some specific examples, the method for removing partial first insulation layer 105 at the top portion of the second part includes, but is not limited to, a dry etching process and a wet etching process.

Herein, two opposite sidewalls of the top portions of two adjacent first semiconductor columns 102 in the first direction are exposed from each first groove 106. In this way, a first protective column 104-1 formed in the first groove 106 in the follow-up process is located between the top portions of two adjacent first semiconductor columns 102 in the first direction, and covers the two opposite sidewalls of the two adjacent first semiconductor columns 102.

Figure 21:
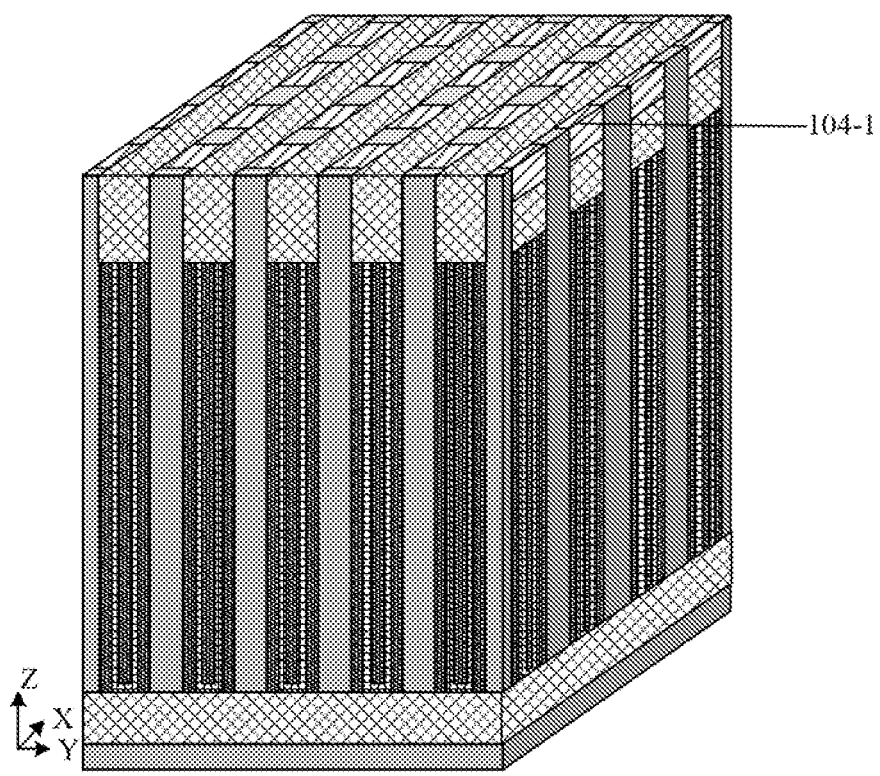

Next, as shown in FIG. 21, the first protective column 104-1 is formed in the first groove 106.

In some specific examples, the method for forming the first protective column 104-1 includes, but is not limited to, PVD, CVD, and ALD.

In some specific examples, a material of the first protective column 104-1 includes, but is not limited to, silicon nitride.

Figure 22:
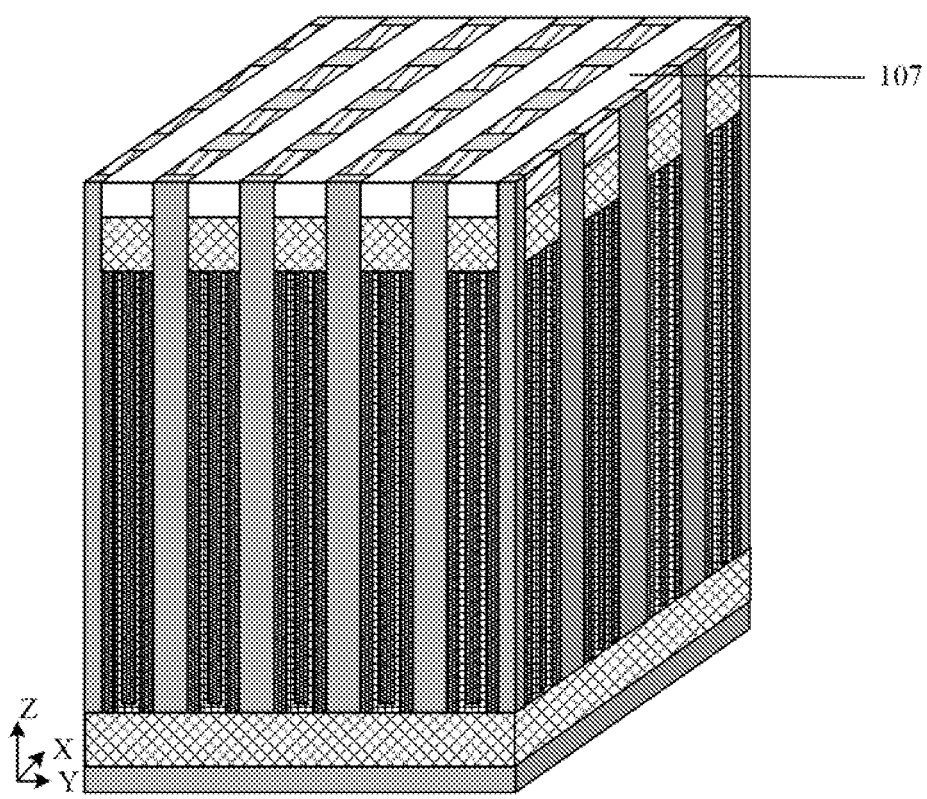

Next, as shown in FIG. 22, the remaining first insulation layer 105 at the top portion of the second part is removed to form a plurality of second grooves 107 that extend in the first direction. Two opposite sidewalls of the top portions of two adjacent first semiconductor columns 102 in the second direction are exposed from each second groove 107.

In some specific examples, the method for removing the remaining first insulation layer 105 at the top portion of the second part includes, but is not limited to, a dry etching process and a wet etching process.

Herein, the first groove 106 extends in the first direction. Two opposite sidewalls of the top portions of two adjacent first semiconductor columns 102 in the second direction are exposed from each second groove 107. In this way, a second protective column 104-2 formed on the sidewalls of the second groove 107 in the follow-up process extends in the first direction, covers the sidewalls of the top portion of the second part that are not covered by the first protective column 104-1, and covers the sidewall of the first protective column 104-1.

Figure 23:
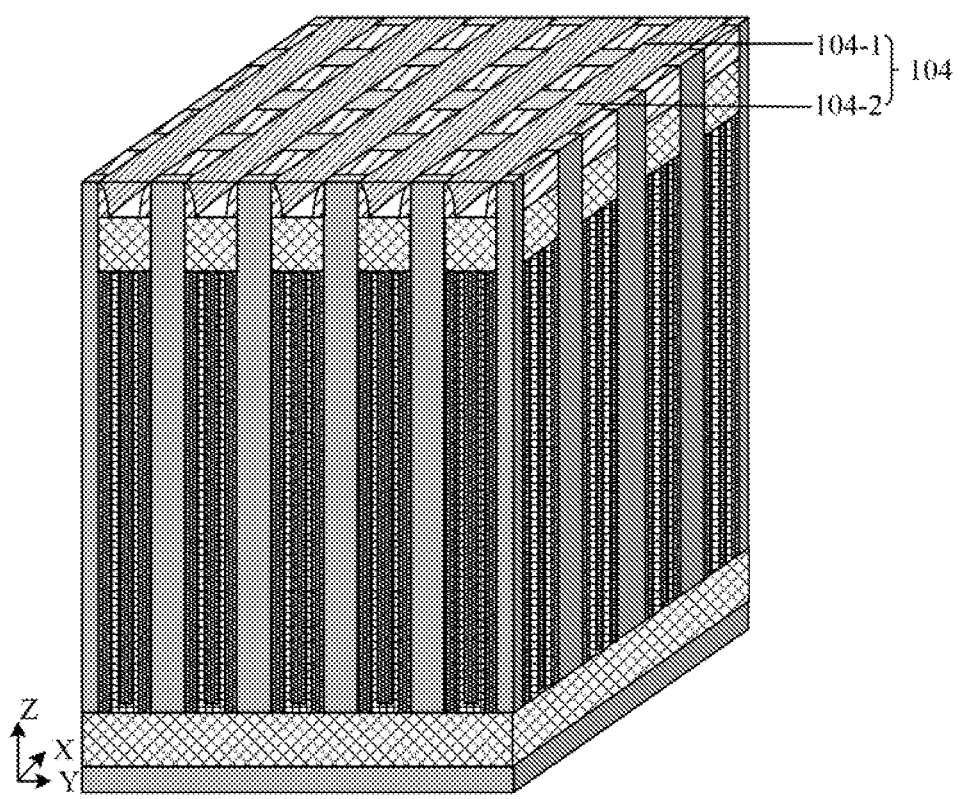

Next, as shown in FIG. 23, a plurality of second protective columns 104-2 are formed on the sidewalls of the second grooves 107.

Herein, the first protective column 104-1 and the second protective column 104-2 jointly constitute a first protective layer 104. The first protective layer 104 covers the sidewalls of the top portion of the second part of the first semiconductor column 102.

In some specific examples, a material of the second protective column 104-2 includes, but is not limited to, silicon nitride.

Herein, the first protective column 104-1 and the second protective column 104-2 may be made of a same material or different materials.

In some specific examples, the method for forming the second protective column 104-2 includes, but is not limited to, PVD, CVD, and ALD.

In some specific examples, a specific process of forming the second protective column 104-2 may be: forming a second protective material layer on the sidewalls and bottom wall of the second groove 107 by means of ALD; removing the second protective material layer at the bottom of the second groove 107 by etching. The remaining second protective material layer on the sidewalls of the second groove 107 constitutes the second protective column 104-2.

It is to be noted that, when the second protective material layer at the bottom of the second groove 107 is removed by etching, the second protective material layer on the sidewalls of the second groove 107 is also partially removed, so that a shape of the second protective column 104-2 in which the diameter width in the second direction gradually decreases from bottom to top as shown in FIG. 23 is formed. However, the shape of the second protective column 104-2 includes, but is not limited to, a sloping shape shown in FIG. 23.

At S400, mainly a transistor is formed. A channel structure of the transistor is located in the intermediate portion of the second part, and an extending direction of the channel structure is the same as an extending direction of the second part.

In some embodiments, the forming the transistor includes the following operations.

The first insulation layer at the intermediate portions of the second parts is removed after the first protective layer is formed, so as to expose the sidewalls of the intermediate portions of the second parts.

A gate oxide layer that covers the sidewalls of the intermediate portion of the second part is formed.

A gate that covers the gate oxide layer is formed.

A source and a drain are respectively formed at the bottom portion and the top portion of the second part.

A second insulation layer is formed between the second protective columns and between the gates.

A process for forming the transistor is described in detail below with reference to FIG. 24 to FIG. 26.

Firstly, the first insulation layer 105 at the intermediate portion of the second part is removed, so as to expose the sidewalls of the intermediate portion of the second part.

In some specific examples, the method for removing the first insulation layer 105 at the intermediate portion of the second part includes, but is not limited to, a dry etching process and a wet etching process.

Figure 24:
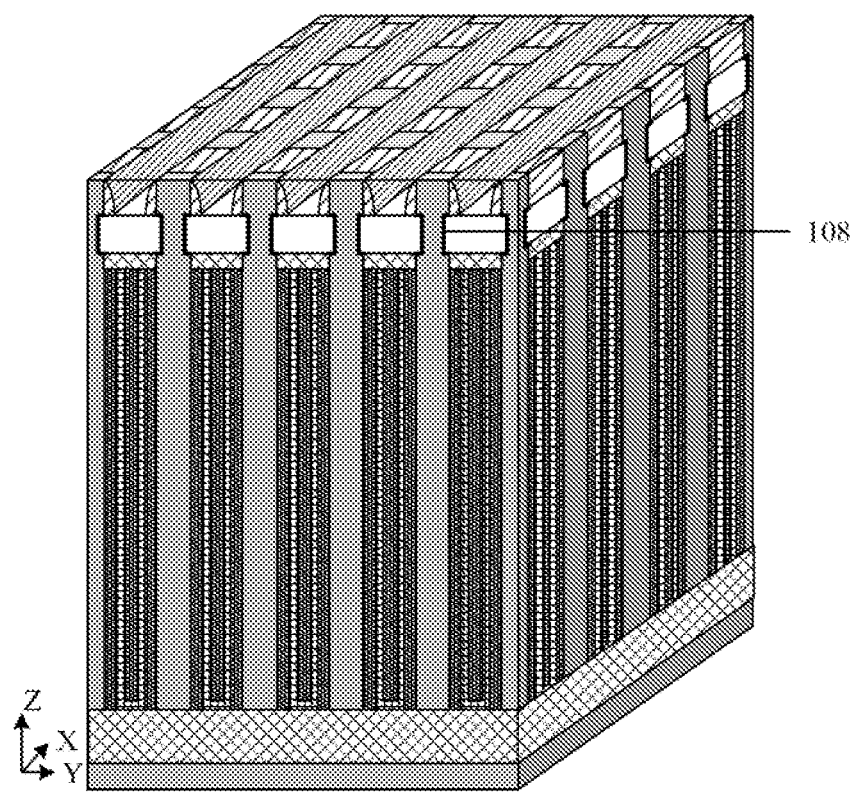

Next, as shown in FIG. 24, a gate oxide layer 108 that covers the sidewalls of the intermediate portion of the second part is formed.

Herein, the gate oxide layer 108 is located between a gate 109 formed in the follow-up process and the channel structure, and is configured to electrically isolate the channel structure from the gate 109, so as to reduce a hot-carrier effect of the transistor.

In some specific examples, the method for forming the gate oxide layer 108 includes, but is not limited to, a thermal oxidation method and ALD.

Exemplarily, after the thermal oxidation method is used to form the gate oxide layer 108, the diameter width of the intermediate portion of the second part is less than the diameter width of the top portion of the part, and is less than the diameter width of the bottom portion of the second part.

In some specific examples, the gate oxide layer 108 includes, but is not limited to, silicon oxide.

Figure 25:
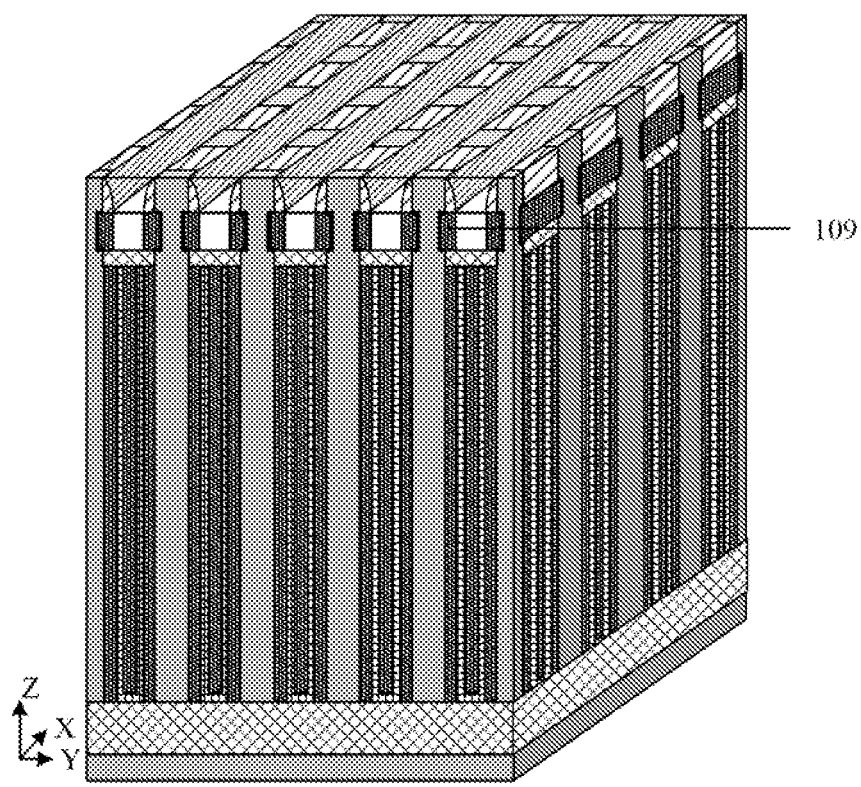

Next, as shown in FIG. 25, a gate 109 covering the gate oxide layer 108 is formed.

In some embodiments, the forming the gate 109 that covers the gate oxide layer 108 includes the following operations.

A gate conductive material is filled in a gap between the gate oxide layers 108.

Partial gate conductive material is removed with the first protective layer 104 as a mask layer, and the remaining gate conductive material forms the gate 109.

In some specific examples, the method for forming the gate conductive material includes, but is not limited to, PVD, CVD, and ALD.

In some specific examples, the gate conductive material may include a metal or polysilicon (Poly) or the like.

It is understandable that, herein, partial gate conductive material is removed with the formed first protective layer 104 as the mask layer to form the gate 109 and form a filling region between the gates 109, so that a second insulation layer 110 is filled in the filling region in the follow-up process, so as to isolate two adjacent gates 109. That is to say, the first protective layer 104 plays a role of not only protecting the sidewalls of the top portion of the second part, but also a mask. Therefore, process steps can be simplified, and the process cost can be reduced as well.

Herein, in different types of transistors, a shape of the gate 109 is different. Exemplarily, in a pillar gate transistor, the gate 109 is formed on a side of the channel structure in the form of a pillar. In a Gate Semi-Around transistor, the gate 109 half surrounds the channel structure. In a Gate All Around (GAA) transistor, the gate 109 completely surrounds the channel structure.

In the embodiments of the disclosure, the type of the transistor may include the above various types, but is not limited thereto. Preferably, the transistor is the GAA transistor.

Next, a source and a drain are respectively formed at the bottom portion and the top portion of the second part. The method for forming the source and the drain includes, but is not limited to a doping process, a diffusion process, and the like.

The first semiconductor column 102 between the source and the drain constitutes the channel structure of the transistor. The channel structure in the embodiments of the disclosure is located in the intermediate portion of the second part, and an extending direction of the channel structure is the same as an extending direction of the second portion.

It is to be noted that, positions of the source and the drain at the bottom portion and the top portion of the second part may be interchanged. An actual situation may be selected to set according to actual requirements.

Figure 26:
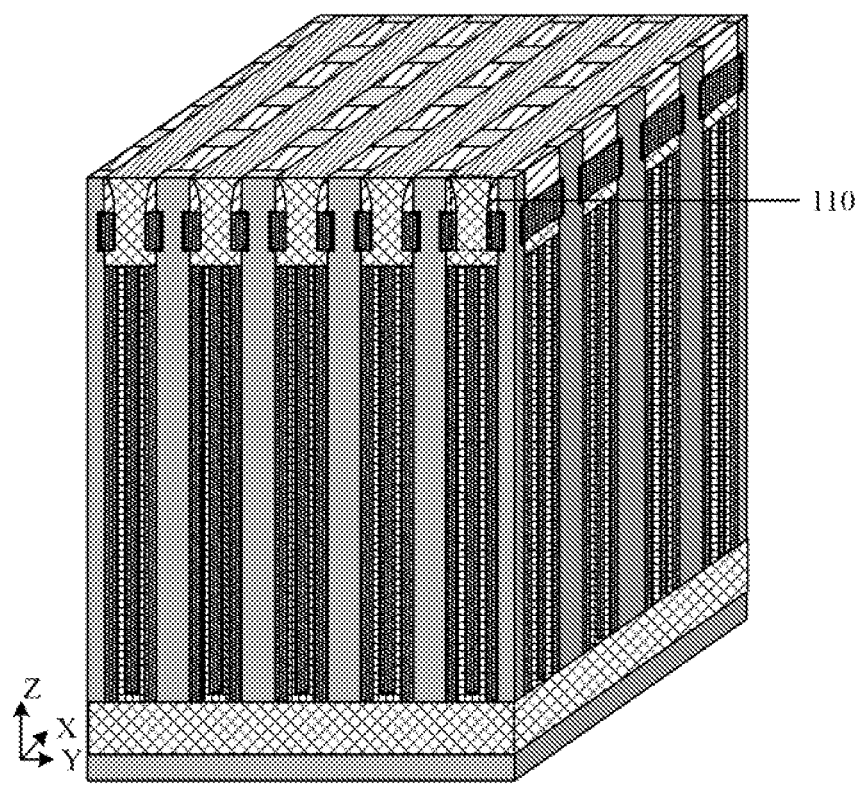

Next, as shown in FIG. 26, a second insulation layer 110 (shown in the dotted box in FIG. 26) is formed between the second protective columns 104-2 and between the gates 109.

In some specific examples, the method for forming the second insulation layer 110 includes, but is not limited to, PVD, CVD, and ALD.

In some specific examples, a material of the second insulation layer 110 includes, but is not limited to, silicon oxide.

Herein, the second insulation layer 110 plays a role of isolating adjacent gates 109, so that mutual interference between the adjacent gates 109 is alleviated.

In some embodiments, the method further includes the following operation.

A plurality of bit lines are formed on the second pans. The bit line is in electric contact with the top portions of the second parts.

It is understandable that, the memory in the above embodiments is of a Transistor on Capacitor (TOC) structure. The structure further includes a plurality of bit lines located on the transistors and in electric contact with the top portions of the first semiconductor columns 102.

It is understandable that, the BL is configured to perform a read or write operation on the transistor when the transistor is turned on.

Herein, the BL is disposed above the transistors, and the BL as a metal BL can reduce a resistance and lowered a process difficulty, which more matches the circuit design of the memory.

It is understandable that, in the embodiments of the disclosure, the first protective layer 104 surrounding the sidewalls of the top portion of the first semiconductor column 102 is formed, so as to protect the sidewalls of the top portion of the second part of the first semiconductor column 102, so that the gate 109 and the gate oxide layer 108 of the transistor can surround the sidewalls of the intermediate portion of the second part of the first semiconductor column 102. Compared with the related art in which the gate conductive material and the gate oxide layer material surrounding the sidewalls of the top portion and the intermediate portion of the second part of the first semiconductor column 102 are first formed, and then the gate conductive material and the gate oxide layer material surrounding the sidewalls of the top portion are removed to form the gate 109 and the gate oxide layer 108, in an aspect, the solution provided in the embodiments of the disclosure can achieve an effect of saving the gate conductive material. In another aspect, the solution provided in the embodiments of the disclosure does not need to etch back the gate conductive material and the gate oxide layer material surrounding the sidewalls of the top portion to form the gate 109 and the gate oxide layer 108. Therefore, process steps can be simplified, and thereby the process cost can be saved.

The embodiments of the disclosure provide a semiconductor structure and a manufacturing method thereof, and a memory. The method for manufacturing a semiconductor structure includes: providing a substrate, and forming, on the substrate, a plurality of first semiconductor columns 102 that are arranged in an array in a first direction and a second direction, where each first semiconductor column 102 includes a first part and a second part located on the first part, the second part includes a bottom portion, an intermediate portion and a top portion that are stacked successively, and the first direction and the second direction intersect with each other and are both parallel to a top surface of the substrate; forming a storage structure 103 surrounding sidewalls of the first part; forming a first protective layer 104 surrounding the sidewalls of the top portion of the second part; and forming a transistor. A channel structure of the transistor is located in the intermediate portion of the second part, and an extending direction of the channel structure is the same as an extending direction of the second part. In the embodiments of the disclosure, in an aspect, by forming the first protective layer 104 surrounding the sidewalls of the top portion of the second part to protect the sidewalls of the top portion of the second part, when the transistor of which the channel structure is located in the intermediate portion of the second part is formed, it is not necessary to first form materials of the transistor that cover the sidewalls of the top portion and the intermediate portion of the second part, and then remove the material of the transistor that covers the sidewalls of the top portion of the second part, so that process steps can be simplified, and the material for forming the transistor can be saved. In another aspect, the first protective layer 104 surrounding the sidewalls of the top portion of the second part may also serve as a mask during the formation of the gate 109, so that the process steps can be simplified, and thereby the manufacturing cost can be reduced.

According to another aspect of the disclosure, the embodiments of the disclosure further provides a semiconductor structure, including a substrate, and a plurality of first semiconductor columns, storage structures, a plurality of transistors and a first protective layer that are located above the substrate.

The plurality of first semiconductor columns are arranged in an array in a first direction and a second direction. Each first semiconductor column includes a first part and a second part located on the first part. The second part includes a bottom portion, an intermediate portion and a top portion that are stacked successively. The first direction and the second direction intersect with each other and are both parallel to a top surface of the substrate.

The storage structure surrounds sidewalls of the first part.

The first protective layer surrounds the sidewalls the top portion of the second part.

A channel structure of each transistor is located in the intermediate portion of the second part, and an extending direction of the channel structure is the same as an extending direction of the second part.

In some embodiments, the first protective layer includes a plurality of first protective columns and a plurality of second protective columns.

The plurality of first protective columns are arranged in an array in the first direction and the second direction. Each of the first protective columns is located between the top portions of two adjacent first semiconductor columns in the first direction, and covers two opposite sidewalls of the two adjacent first semiconductor columns.

Each of the second protective columns extends in the first direction, covers the sidewalls of the top portion of the second part that is not covered by the first protective column, and covers the sidewall of the first protective column.

In some embodiments, each of the transistors includes: a gate oxide layer disposed around the intermediate portion of the second part, a gate disposed around the gate oxide layer, and a source and a drain that are respectively disposed at the bottom portion and top portion of the second part. A surface of the gate that is away from the gate oxide layer is flush with an edge of a bottom of the second protective column that is away from the second part.

In some embodiments, a diameter width of the intermediate portion of the second part is less than a diameter width of the top portion of the part, and is less than a diameter width of the bottom portion of the second part.

In some embodiments, the semiconductor structure further includes a plurality of oxidation columns and first oxide layers.

Each of the first semiconductor columns is located on a top surface of one oxidation column, and the first oxide layer is located between adjacent oxidation columns.

In some embodiments, the storage structure includes a first electrode layer, a dielectric layer and a second electrode layer.

The first electrode layer covers the sidewalls of the first part.

The dielectric layer covers at least a surface of the first electrode layer.

The second electrode layer covers a surface of the dielectric layer, and the storage structure covers a surface of the first oxide layer.

In some embodiments, the semiconductor structure further includes a plurality of bit lines.

The plurality of BLs are located on the transistors and in electric contact with the top portions of the second parts.

According to still another aspect of the disclosure, the embodiments of the disclosure further provides a memory, including at least one semiconductor structure described in any one of the above embodiments of the disclosure.

The semiconductor structure and memory provided in the above embodiments have been described in detail on the method side, and are not described herein again.

In several embodiments provided by the disclosure, it is to be understood that the disclosed device and method may be implemented in non-targeted ways. The device embodiments described above are only schematic. For example, division of the units is only a logic function division, and other division manners may be adopted during practical implementation. For example, a plurality of units or components may be combined or integrated into another system, or some features may be neglected or not executed. In addition, the components shown or discussed are coupled or directly coupled to each other.

The features disclosed in several method or device embodiments provided in the disclosure can be combined arbitrarily without conflict to obtain a new method embodiment or device embodiment.

The above is only the specific implementations of the disclosure and not intended to limit the scope of protection of the disclosure. Any variations or replacements apparent to those skilled in the art within the technical scope disclosed by the disclosure shall fall within the scope of protection of the disclosure. Therefore, the protection scope of the disclosure shall be subject to the protection scope of the claims.

What is claimed is:

1. A semiconductor structure, comprising a substrate, a plurality of oxidation columns and first oxide layers, a plurality of first semiconductor columns, a storage structure, a plurality of transistors and a first protective layer that are located above the substrate, wherein
the plurality of first semiconductor columns are arranged in an array in a first direction and a second direction; and each first semiconductor column comprises a first part and a second part located on the first part, wherein the second part comprises a bottom portion, an intermediate portion and a top portion that are stacked successively; the first direction and the second direction intersect with each other and are both parallel to a top surface of the substrate;
each of the first semiconductor columns is located on a top surface of one oxidation column, and the first oxide layers are located between adjacent oxidation columns;
the storage structure surrounds sidewalls of the first parts;
the first protective layer surrounds sidewalls of the top portions of the second parts; and
a channel structure of each transistor is located in the intermediate portion of the second part, and an extending direction of the channel structure is the same as an extending direction of the second part.

2. The semiconductor structure of claim 1, wherein a diameter width of the intermediate portion of the second part is less than a diameter width of the top portion of the second part, and is less than a diameter width of the bottom portion of the second part.

3. The semiconductor structure of claim 1, wherein the storage structure comprises a first electrode layer, a dielectric layer and a second electrode layer; wherein
the first electrode layer covers the sidewalls of the first part;
the dielectric layer covers at least a surface of the first electrode layer; and
the second electrode layer covers a surface of the dielectric layer, and the storage structure covers surfaces of the first oxide layers.

4. The semiconductor structure of claim 1, further comprising:
a plurality of bit lines, located on the transistors and in electric contact with the top portions of the second parts.

5. A memory, comprising the semiconductor structure of claim 1.

6. The semiconductor structure of claim 1, wherein the first protective layer comprises a plurality of first protective columns and a plurality of second protective columns, wherein
the plurality of first protective columns are arranged in an array in the first direction and the second direction; each of the first protective columns is located between top portions of two adjacent first semiconductor columns in the first direction, and covers two opposite sidewalls of the two adjacent first semiconductor columns; and
each of the second protective columns extends in the first direction, covers the sidewalls of the top portions of the second parts that are not covered by the first protective columns, and covers sidewalls of the first protective columns.

7. The semiconductor structure of claim 6, wherein each of the transistors comprises a gate oxide layer disposed around the intermediate portion of the second part, a gate disposed around the gate oxide layer, and a source and a drain that are respectively disposed at the bottom portion and top portion of the second part; wherein a surface of the gate that is away from the gate oxide layer is flush with an edge of a bottom of the second protective column that is away from the second part.

8. A method for manufacturing a semiconductor structure, comprising:
providing a substrate, and forming, on the substrate, a plurality of first semiconductor columns that are arranged in an array in a first direction and a second direction, wherein each first semiconductor column comprises a first part and a second part located on the first part, wherein the second part comprises a bottom portion, an intermediate portion and a top portion that are stacked successively, and the first direction and the second direction intersect with each other and are both parallel to a top surface of the substrate;

forming a storage structure surrounding sidewalls of the first parts;

forming a first protective layer surrounding sidewalls of the top portions of the second parts; and forming transistors, wherein a channel structure of each transistor is located in the intermediate portion of the second part, and an extending direction of the channel structure is the same as an extending direction of the second part;

wherein the forming the first semiconductor columns comprises:

providing a semiconductor base;

forming, in the semiconductor base, a plurality of first trenches that are spaced in the first direction, and forming a third insulation layer in the first trenches and on a surface of the semiconductor base; and etching the semiconductor base and the third insulation layer to form a plurality of second trenches that are spaced in the second direction, wherein a bottom surface of the first trench is lower than a bottom surface of the second trench, and the semiconductor base is divided into the plurality of first semiconductor columns by the first trenches and the second trenches.

9. The method for manufacturing a semiconductor structure of claim 8, further comprising:

forming a plurality of bit lines on the second parts, wherein the bit lines are in electric contact with the top portions of the second parts.

10. The method for manufacturing a semiconductor structure of claim 8, wherein the forming the first protective layer comprises:

forming a first insulation layer between the second parts;

removing partial first insulation layer at the top portions of the second parts to form a plurality of first grooves, wherein two opposite sidewalls of top portions of two adjacent first semiconductor columns in the first direction are exposed from each of the first grooves;

filling the first grooves to form a plurality of first protective columns;

removing remaining first insulation layer at the top portions of the second parts to form a plurality of second grooves that extend in the first direction, wherein two opposite sidewalls of top portions of two adjacent first semiconductor columns in the second direction are exposed from each of the second grooves; and forming a plurality of second protective columns on sidewalls of the second grooves, wherein the first protective columns and the second protective columns jointly constitute the first protective layer.

11. The method for manufacturing a semiconductor structure of claim 10, wherein the forming the transistors comprises:

removing the first insulation layer at the intermediate portions of the second parts after the first protective layer is formed, so as to expose sidewalls of the intermediate portions of the second parts;

forming a gate oxide layer that covers the sidewalls of the intermediate portion of the second part;

forming a gate that covers the gate oxide layer;

respectively forming a source and a drain at the bottom portion and the top portion of the second part; and forming a second insulation layer between the second protective columns and between gates.

12. The method for manufacturing a semiconductor structure of claim 11, wherein the forming the gate that covers the gate oxide layer comprises:

filling a gate conductive material in a gap between gate oxide layers; and removing partial gate conductive material with the first protective layer as a mask layer, and remaining gate conductive material forms the gate.

13. The method for manufacturing a semiconductor structure of claim 8, further comprising: forming second protective layers on sidewalls of each of the second trenches;

etching the semiconductor base at a bottom of the second trench, to form an enlarged third trench, wherein a bottom surface of the third trench is flush with the bottom surface of the first trench;

wherein a plurality of second semiconductor columns are formed between adjacent third trenches, wherein each of the first semiconductor columns is located on one corresponding second semiconductor column, and a maximum diameter width of the second semiconductor column in the second direction is less than a minimum diameter width of the first semiconductor column; and oxidizing the second semiconductor columns, to cause the second semiconductor columns to be completely oxidized into oxidation columns.

14. The method for manufacturing a semiconductor structure of claim 13, further comprising: filling a sacrificial material in the second trench after the second protective layers are formed;

removing the third insulation layer, the second protective layers and the sacrificial material that are located above the first semiconductor columns;

forming, on top surfaces of the first semiconductor columns, a plurality of first support material layers that are spaced in the first direction and extend in the second direction; and removing remaining sacrificial material, and etching the semiconductor base along the bottom of the second trench.

15. The method for manufacturing a semiconductor structure of claim 14, further comprising: filling first oxide layers between the first support material layers, between the second protective layers and between the oxidation columns;

removing partial first support material layers and partial first oxide layers above the top surfaces of the first semiconductor columns, so as to form a plurality of third grooves extending in the first direction, wherein remaining first support material layers constitute a first support layer; and forming a second support layer in the third grooves, wherein the first support layer and the second support layer jointly constitute a grid-like top support layer.

16. The method for manufacturing a semiconductor structure of claim 15, wherein the forming the storage structure comprises:

removing partial first oxide layers and the second protective layers;

successively filling a first conductive material, a dielectric layer material and a second conductive material between the first semiconductor columns; and removing the top support layer, and removing the first conductive material, the dielectric layer material and the second conductive material between the second parts by etching back, wherein the first conductive material, the dielectric layer material and the second conductive material remaining between the first parts jointly constitute the storage structure.

17. A method for manufacturing a semiconductor structure, comprising:

providing a substrate, and forming, on the substrate, a plurality of first semiconductor columns that are arranged in an array in a first direction and a second direction, wherein each first semiconductor column comprises a first part and a second part located on the first part, wherein the second part comprises a bottom portion, an intermediate portion and a top portion that are stacked successively, and the first direction and the second direction intersect with each other and are both parallel to a top surface of the substrate;

forming a storage structure surrounding sidewalls of the first parts;

forming a first protective layer surrounding sidewalls of the top portions of the second parts; and forming transistors, wherein a channel structure of each transistor is located in the intermediate portion of the second part, and an extending direction of the channel structure is the same as an extending direction of the second part;

wherein the forming the first protective layer comprises:

forming a first insulation layer between the second parts;

removing partial first insulation layer at the top portions of the second parts to form a plurality of first grooves, wherein two opposite sidewalls of top portions of two adjacent first semiconductor columns in the first direction are exposed from each of the first grooves;

filling the first grooves to form a plurality of first protective columns;

removing remaining first insulation layer at the top portions of the second parts to form a plurality of second grooves that extend in the first direction, wherein two opposite sidewalls of top portions of two adjacent first semiconductor columns in the second direction are exposed from each of the second grooves; and forming a plurality of second protective columns on sidewalls of the second grooves, wherein the first protective columns and the second protective columns jointly constitute the first protective layer.

18. The method for manufacturing a semiconductor structure of claim 17, wherein the forming the transistors comprises:

removing the first insulation layer at the intermediate portions of the second parts after the first protective layer is formed, so as to expose sidewalls of the intermediate portions of the second parts;

forming a gate oxide layer that covers the sidewalls of the intermediate portion of the second part;

forming a gate that covers the gate oxide layer;

respectively forming a source and a drain at the bottom portion and the top portion of the second part; and forming a second insulation layer between the second protective columns and between gates.

19. The method for manufacturing a semiconductor structure of claim 18, wherein the forming the gate that covers the gate oxide layer comprises:

filling a gate conductive material in a gap between gate oxide layers; and removing partial gate conductive material with the first protective layer as a mask layer, and remaining gate conductive material forms the gate.

20. The method for manufacturing a semiconductor structure of claim 17, further comprising:

forming a plurality of bit lines on the second parts, wherein the bit lines are in electric contact with the top portions of the second parts.

* * * * *